United States Patent [19]

Yoshida et al.

[11] Patent Number: 4,656,610
[45] Date of Patent: Apr. 7, 1987

[54] SEMICONDUCTOR MEMORY DEVICE HAVING REDUNDANCY MEANS

[75] Inventors: Masahiro Yoshida, Tachikawa; Kanji Oishi, Koganei, both of Japan

[73] Assignee: Hitachi, Ltd., Tokyo, Japan

[21] Appl. No.: 573,139

[22] Filed: Jan. 23, 1984

[30] Foreign Application Priority Data

Jan. 21, 1983 [JP] Japan .................................. 58-7272

[51] Int. Cl.⁴ ............................................. G11C 11/40
[52] U.S. Cl. .................................... 365/200; 371/10; 371/21; 365/189
[58] Field of Search ................. 365/200, 189; 371/10, 371/21

[56] References Cited

U.S. PATENT DOCUMENTS

| 4,051,354 | 9/1977 | Choate | 365/200 |
|---|---|---|---|
| 4,346,459 | 8/1982 | Sud et al. | 371/10 |
| 4,376,300 | 3/1983 | Tsang | 365/200 |
| 4,459,685 | 7/1984 | Sud et al. | 371/10 |
| 4,463,450 | 7/1984 | Haeusele | 365/200 |
| 4,473,895 | 9/1984 | Tatematsu | 365/200 |

FOREIGN PATENT DOCUMENTS

| 0031386 | 7/1981 | European Pat. Off. . |
|---|---|---|
| 0034070 | 8/1981 | European Pat. Off. . |
| 0047859 | 3/1982 | European Pat. Off. . |
| 0059309 | 9/1982 | European Pat. Off. . |
| WO81/02360 | 8/1981 | PCT Int'l Appl . |
| 1354849 | 5/1974 | United Kingdom . |
| 1550675 | 8/1979 | United Kingdom . |

Primary Examiner—Terrell W. Fears
Attorney, Agent, or Firm—Antonelli, Terry & Wands

[57] ABSTRACT

The semiconductor memory device includes at least two memory arrays, a first selection circuit which selects a memory cell from either one of the memory arrays in accordance with address signals, preferably two spare memory arrays and a second selection circuit which selects a memory cell from either one of the spare memory arrays. If a defective memory cell or cells are contained in one of the two memory arrays, the second selection circuit an select a spare memory cell or cells from any of the two spare memory arrays in place of the defective memory cell or cells. Thus, the spare memory arrays can be used effectively. Two sets of main amplifiers are also disposed and only one of them, which receives the data from the memory cell selected from the memory arrays or spare memory arrays, is operated. Thus, lower power consumption can be realized.

22 Claims, 9 Drawing Figures

SEMICONDUCTOR MEMORY DEVICE HAVING REDUNDANCY MEANS

BACKGROUND OF THE INVENTION

This invention relates to a semiconductor memory device.

To improve the yield of products, the application of redundancy techniques to semiconductor memory devices (hereinafter referred to as the "memory") has been examined. Fail bits for which read and write of data are not possible are unavoidably formed in memory devices due to the variance of production conditions or to defects in masks used for the production. To cope with this problem, spare bits are disposed in advance in the memory so that they are selected in place of the fail bits. Thus, the memory can be regarded as if it were free from the fail bits.

When applying the redundancy-relieving techniques to a memory, an arrangement has been considered in which spare columns (constituted by spare data lines and spare bits connected to the former) are provided so that the spare columns are selected in place of the defective data lines containing the fail bits. In other words, additional circuits such as the spare columns, an address comparison circuit and a memory circuit for storing the address signals of the defective columns are disposed in the memory. When the address signals are applied to the memory, they are compared with the address signals of defective columns stored in the memory circuit by the address comparison circuit. When the address signals applied to the memory coincide with the address signals of the defective columns stored in the memory circuit, a coincidence signal is generated from the address comparison circuit. This coincidence signal brings the column containing the fail bits (defective data lines) into the non-selection state and instead, the spare columns are selected.

In the course of developing the invention, the inventors designed a memory of a byte (×8 bits) construction, that is, a memory in which write and read of data is effected in the 8-bit unit. Such a memory was constructed so that eight memory arrays (mats) were disposed and one bit each was selected from each memory array so that 8-bit data could be read or written. In such a memory, column decoders and column switches were densely formed in order to select one bit from each memory array. From the inventors' experiments with this memory it was determined that if the redundancy techniques which change over the defective data lines to the spare data lines are applied to such a memory, it becomes difficult to change over the defective data lines to the spare data lines. The changeover operation for changing the defective data lines to the spare data lines for each memory array becomes complicated, too.

In the memory of the type described above, delicate fabrication techniques using a laser beam may be employed as a method of changing the defective data lines to the spare data lines. In other words, the wirings themselves are changed over from the defective data lines to the spare data lines by the laser beam.

To change over the wirings by such a laser beam, expensive equipment becomes necessary and hence, the cost of production of the semiconductor memory device becomes higher while the test efficiency drops.

Accordingly, the inventors of the present invention allot the multi-bit address to a plurality of data lines adjacent one another inside the same memory array (mat) in order to secure a space in which a column address decoder is formed, and change over the plurality of data lines as a lot (i.e. a unit) to a plurality of spare data lines when a defect exists in the memory array data lines. Also, the present invention provides an arrangement having at least one spare memory array used in conjunction with at least two memory arrays with a redundancy circuit and change-over circuit for recognizing when the data line address request for either of the memory arrays is for a location having a fail bit and for selecting a data line from the spare memory when this occurs. To this end, either the first or second memory arrays can be selected under normal operation and the spare memory array can be selected when a defective location is requested, and this can be accomplished without the need for a laser beam rewiring structure.

In addition to the above, in fabricating a semiconductor memory device having a large memory capacity such as 256K bits (8×32K bits), for example, the memory mat is preferably divided into a plurality of memory mats in order to reduce the length of word lines and data lines and to improve its high speed operation. The present invention provides an arrangement to improve the utilization ratio of the spare data lines, that is, the relief ratio of the fail bits, by using the spare data lines in the one mat not only as spare data lines for said one mat but also as spare data lines in the other mat, that is, by using the spare data lines in the one mat selectively as spare data lines for the one mat or as spare data lines in the other mat, when the memory mat is divided into a plurality of mats.

SUMMARY OF THE INVENTION

It is therefore an object of the present invention to provide a semiconductor memory device which improves the relief ratio of fail bits.

It is another object of the present invention to provide an economical semiconductor memory device.

It is still another object of the present invention to provide a semiconductor memory device which can reduce power consumption.

These and other objects of the present invention will become more apparent from the following description and the accompanying drawings.

DESCRIPTION OF THE PREFERRED EMBODIMENTS

Figure 1:
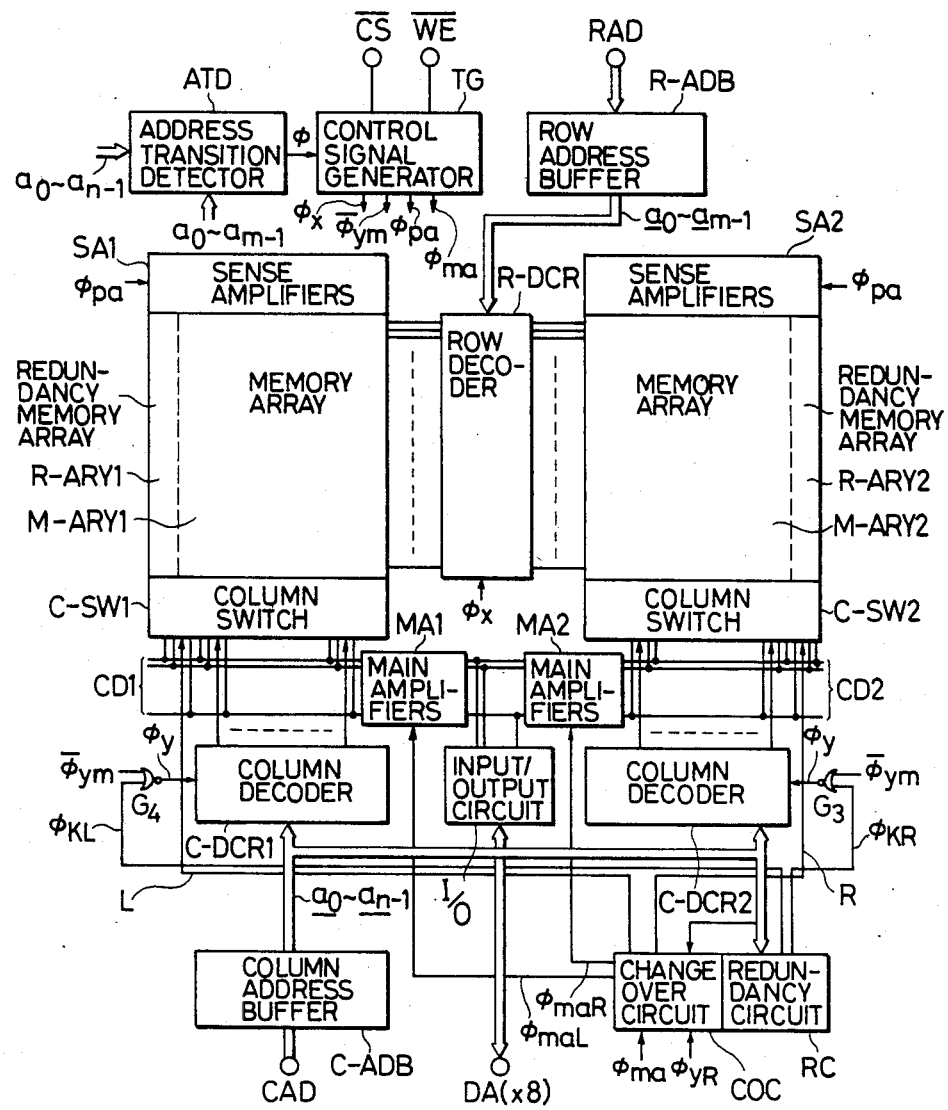
FIG. 1 is a block diagram showing one embodiment of the present invention.

FIG. 1 is a schematic block diagram of an example of a dynamic random access memory (hereinafter called "RAM") to which the present invention is applied.

The drawing illustrates the internal construction of a dynamic RAM in which input and output are applied and produced in the 8-bit unit, that is, a dynamic RAM of a byte structure, though the present invention is not particularly limited to such a dynamic RAM.

Each block shown in the drawing is formed on one semiconductor substrate such as a silicon substrate by known semiconductor integrated circuit techniques. The main circuit blocks in the drawing are depicted to match with the geometric arrangement of the blocks in a practical semiconductor integrated circuit.

In this embodiment, the memory array is divided into right and left arrays M-ARY1 and M-ARY2, though this is not particularly limitative. Each memory array consists of a plurality of memory cells arranged in the matrix form.

In each memory array M-ARY1, M-ARY2, eight complementary data line pairs form one set and a plurality of such sets are formed. Each complementary data line pair is formed so as to extend in the longitudinal direction (i.e. from top to bottom) as viewed in the drawing.

Therefore, this embodiment is not a type in which the memory array is divided into eight blocks (mats) and one bit apiece is selected from each block. Instead, one address is alloted to the eight sets of complementary data line pairs adjacent one another inside the same memory array and the eight bits (eight memory cells) are selected from a plurality of memory cells connected respectively to the mutually adjacent eight sets of complementary data line pairs. The respective complementary data line pairs are sequentially disposed relative to one another in the transverse direction (i.e. left to right) in the drawing.

Row system address selection lines (word lines) are arranged to extend in common in the transverse direction with respect to each memory array M-ARY1, M-ARY2 and are shown sequentially disposed in the longitudinal direction in the drawing.

Each complementary data line pair is connected to eight pairs of common complementary data line pairs CD1, CD2 via column switches C-SW1, C-SW2. In the drawing, the common complementary data line pairs are shown formed to extend in the transverse direction. The common complementary data line pair CD1, CD2 are connected to the input terminals of main amplifiers MA1, MA2, respectively.

Sense amplifiers SA1, SA2 receive a delicate read voltage across the complementary data lines and are made operative by timing signals $\phi_{pa}$. In other words, the sense amplifiers receive the read voltage, which is transmitted to the complementary data lines from the memory cells selected by the output signals of a row decoder R-DCR, amplify the respective potentials of the complementary data line pairs and bring them to the high/low levels.

A row address buffer R-ADB receives an m-bit address signal RAD from the external terminal, generates internal complementary address signals $a0$ through $am-1$ and delivers them to the row address decoder R-DCR.

The row address decoder R-DCR selects one word line in accordance with the address signals $a0$ through $am-1$ in synchronism with the word line selection timing signal $\phi x$.

A column address buffer C-ADB receives an n-bit address signal CAD from the external terminal, generates internal complementary address signals $a0$ through $an-1$ and delivers them to the column address decoder C-DCR.

To select eight complementary data line pairs in accordance with the addresses $a0$ through $an-1$ described above, the column address decoder C-DCR decodes the address signals $a0$ through $an-1$ and generates selecting signals on the basis of the resulting decoded signals and the data line selecting timing signals $\phi y$. The selecting signal is formed by the substantial logical product of the decoded signal and the timing signal $\phi y$, though the invention is not particularly limited to this.

The internal complementary address signals $a0$ through $am-1$ ($a0$ through $an-1$) consist of the internal address signals $a0$ through $am-1$ ($a0$ through $an-1$) having the same phase as the address signals RAD (CAD) and the internal address signals $\bar{a}0$ through $\bar{am-1}$ ($\bar{a}0$ through $\bar{an-1}$) whose phase is inverted with respect to the former.

The column switches C-SW1 and C-SW2 receive the selecting signals described above and connect the eight complementary data line pairs determined by the internal complementary address signals $a0$ through $an-1$ to the corresponding eight common complementary data pairs.

Among a plurality of sets each formed by the eight complementary data line pairs, only the set determined by the internal complementary address signals $a0$ through $an-1$ is selected by the column switch and the eight complementary data line pairs forming that set are connected to the corresponding common complementary data line pairs.

Though not particularly limitative, the internal complementary address signal $an-1$ of the highest order among a plurality of internal complementary address signals $a0$ through $an-1$ is the address signal which decides whether the memory cells from the memory array M-ARY1 on the left side are to be selected or the memory cells from the memory array M-ARY2 on the right side are to be selected. In other words, the internal address signal $an-1$ of the highest order is the address signal which decides whether the complementary data line pairs in the memory array M-ARY1 on the left or the complementary data line pairs in the memory array M-ARY2 on the right are to be connected to the common complementary data line pairs.

Though not particularly limitative, the complementary data line pairs in the memory array M-ARY1 on the left are connected to the common complementary data line pairs when the highest order address signal $an-1$ is at the high level (logic "1"). When it is at the low level (logic "0"), the complementary data line pairs in the memory array M-ARY2 on the right are connected to the common complementary data line pairs.

In the drawing, the complementary data line pair and the common complementary data line are represented by one each line to simplify the illustration.

Though not particularly limitative, the timing signal $\phi y$ is generated by an NOR circuit $G_3$ ($G_4$) which receives the timing signal $\phi ym$ generated in the control signal generator TG (discussed in detail hereinafter) and the killer signal $\phi_{KL}$ generated by the redundancy circuit (discussed in detail hereinafter).

As will be explained later in detail with reference to FIG. 3, the killer signal $\phi_{KL}$ is brought to the high level (logic "1") when a redundancy memory array (spare memory array) R-ARY, which is disposed in order to relieve the fail bits, is used. Accordingly, when this occurs, the timing signal $\phi_y$ described above falls to the low level (logic "0") irrespective of the timing signal $\overline{\phi}_{ym}$ and the selecting signal also falls to the low level (logic "0") irrespective of the decoded signal described already. As a result, the complementary data line pair inside the memory array M-ARY which would otherwise be selected is not connected to the common complementary data lines via the column switch.

When the memory array M-ARY is selected, on the other hand, the killer signal $\phi_{KL}$ ($\phi_{KR}$) falls to the low level (logic "0"). Since the timing signal $\phi_{ym}$ falls to the low level in this instance, the timing signal $\phi_y$ described above rises to the high level (logic "1") in response to the fall of the former, thus forming the selection signal in accordance with the decoded signal described above. As a result, the eight complementary data line pairs in accordance with the internal complementary address signals $\underline{a}0$ through $\underline{a}n-1$ are connected to the corresponding common complementary data line pairs via the column switch.

An input/output circuit I/0 consists of a data output buffer for read and a data input buffer for write. The output signals of one of the main amplifiers MA1 and MA2, which is made operative at the time of read, are amplified by the data output buffer and are then applied to the output terminal DA. When executing the write operation, the write data that are given to the external terminal DA are applied to the common complementary data line pairs CD1 and CD2 via the data input buffer described above. The signal route for this write operation is not shown in the drawing to simplify the illustration.

The data output buffer and the data input buffer are operated complementarily by control signals not shown, though such an arrangement is not limitative, in particular.

The control signal generator TG generates various kinds of timing signals such as $\phi_x$, $\overline{\phi}_{ym}$, $\phi_{pa}$ and $\phi_{ma}$ necessary for the memory operation upon receiving chip select signals $\overline{CS}$, write enable signals $\overline{WE}$ and the output signals (change detection signals) $\phi$ of the address transition detector ATD which will be described next in detail.

Figure 5:
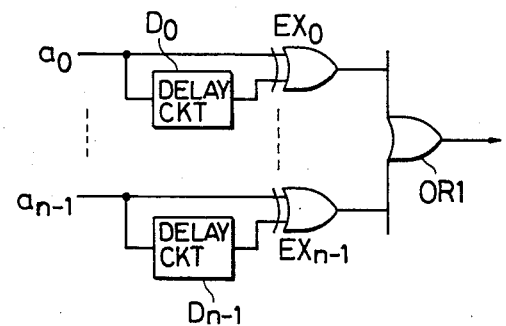
FIG. 5 is a circuit diagram showing an example of an address transition detector used in the present invention.

FIG. 5 is a circuit diagram showing an example of such an address transition detector disposed in the address transition detector ATD of FIG. 1 for the column address signals CAD.

The address transition detector of FIG. 5 consists of exclusive-OR circuits $EX_o$ through $EX_{n-1}$ which receive the address signals $a_o$ through $a_{n-1}$ and the delay signals of the address signals formed by passing the latter through delay circuits $D_o$ through $D_{n-1}$, and an OR circuit OR1 receiving the output signals of these exclusive-OR circuits, though the construction is not limitative, in particular.

When any of the address signals change, that is, when the potentials of the address signals change, the address transition detector detects this change and generates a change detection signal of the address signal.

In the embodiment of FIG. 1 described above, the address transition detector ATD also includes a circuit similar to FIG. 5 to operate as an address transition detector for the row address signals RAD. This detector will receive the row address signals $a_o \sim a_{m-1}$, and preferably has the same construction as that of the address transition detector shown in FIG. 5 for the column address signals CAD, though the invention is not limited to this in particular. When the exclusive-OR between the output signal of the address transition detector for the column address signals CAD and that for the row address signals is obtained, the output signals $\phi$ of an address transition detector ATD of FIG. 1 is produced.

Accordingly, when any of the address signals $a_o$ through $a_{n-1}$ and $a_o$ through $a_{m-1}$ change, the address transition detector ATD produces the change detection signals $\phi$ of the address signals in response to the change.

In this embodiment, redundancy memory arrays R-ARY1 and R-ARY2 are disposed for the memory arrays M-ARY1 and M-ARY2, respectively. Also provided is a redundancy circuit RC which includes address memory circuits which store the address signals for the defective data lines to which fail bits (defective memory cells) are connected or the data line which are short-circuited, that is, the address signals (defective address signals) selecting such defective data line. The redundancy circuit RC also includes a column address comparison circuit which compares the defective address signal with the address signal produced from the column address buffer C-ADB and detects whether or not the stored defective address signal is being applied to the dynamic RAM.

When the address signal CAD designates the defective address signal, the redundancy circuit RC detects it and produces a killer signal for inhibiting the selecting operation of the defective data lines inside the memory arrays M-ARY1 and M-ARY2. At the same time, the redundancy circuit RC produces the defective address detection signals for coupling to a change-over circuit COC.

Upon receiving the defective address detection signal from the redundancy circuit RC, the address signal from the column address buffer C-ADB and the redundancy selection timing signal $\phi_{YR}$, the changeover circuit COC produces those selections signals L and R which select the data line pair of either the redundancy memory array R-ARY1 or R-ARY2. It also receives a main amplifier active signal $\phi_{ma}$ and when the memory array M-ARY1 on the left or the redundancy array R-ARY1 on the left is selected, the change-over circuit COC produces an active signal $\phi_{maL}$ for activating the main amplifier MA1 on the left. On the other hand, when the memory array M-ARY2 on the right or the redundancy array R-ARY2 on the right is selected, the change-over circuit COC produces an active signal $\phi_{maR}$ for activating the main amplifier MA2 on the right.

The redundancy circuit RC and change-over circuit COC will be described later in further detail with reference to FIGS. 3 and 4.

Incidentally, the selection timing signal $\phi_{YR}$ for redundancy is set to the high level, for example, only when the redundancy memory array is used, whereby the change-over circuit COC can select the redundancy memory array. As will be described in detail with reference to FIG. 8, this timing signal $\phi_{YR}$ is produced on the basis of the defective address detection signal which is the output signal of the redundancy circuit RC.

Though redundancy memory arrays can be disposed for defective word lines, they are omitted from FIG. 1 for the simplification of the drawing.

Figure 6:
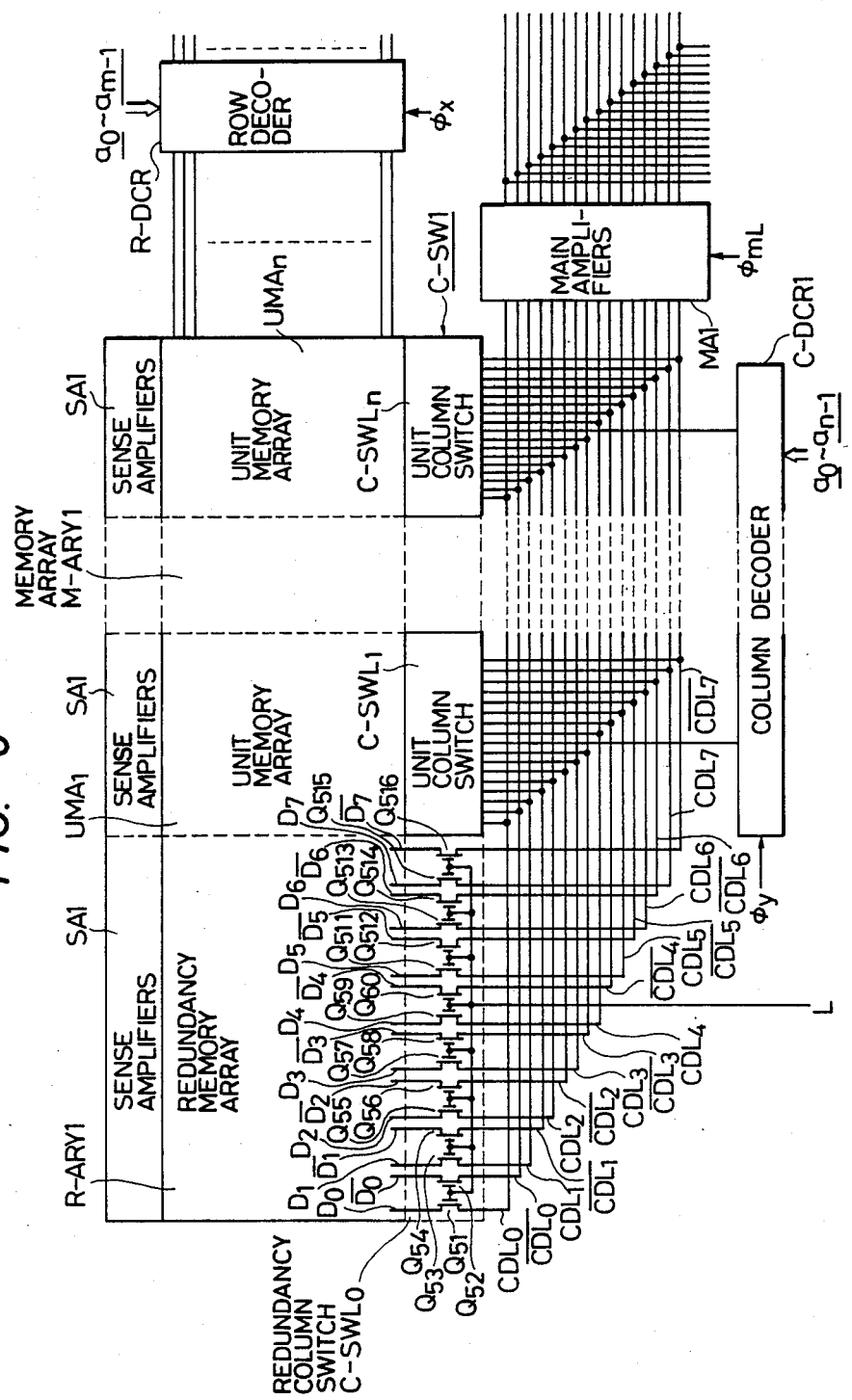
FIG. 6 is a circuit diagram showing another specific example of a part of the embodiment shown in FIG. 1.

FIG. 6 is a circuit diagram showing an example of the memory array M-ARY1, redundancy memory array R-ARY1 and its selection circuit that are shown on one side (left side) in FIG. 1.

In the following description, an insulated gate field effect transistor (hereinafter referred to as "MOSFET") is an MOSFET of an n-channel type, unless otherwise specified.

In this embodiment, eight sets of common complementary data line pairs $CDL_o$-$CDL_7$ and $\overline{CDL}_o$-$\overline{CDL}_7$ are formed in order to enable read and write in the 8-bit unit, though the construction is not particularly limitative.

Though not limitative in particular, the redundancy memory array R-ARY1 includes eight sets of complementary data line pairs $D_o$-$D_7$ and $\overline{D}_o$-$\overline{D}_7$, a plurality of word lines formed to cross the complementary data lines and connected to the row decoder R-DCR, and a plurality of memory cells arranged at these points of intersection in accordance with a predetermined rule.

The memory array M-ARY1 is composed of a plurality of unit memory arrays having mutually the same construction, though this arrangement is not limitative, in particular. Each unit memory array is constituted in the same way as the redundancy memory array R-ARY1 described above, though not particularly limited thereto. In other words, one unit memory array includes eight sets of complementary data line pairs, a plurality of word lines formed to cross these complementary data line pairs and a plurality of memory cells arranged at these points of intersection in accordance with a predetermined rule.

Sense amplifiers are connected to the complementary data line pairs, respectively. In the drawing, these sense amplifiers are altogether represented by "sense amplifier SA1" for simplification.

The column switch C-SW1 consists of a plurality of unit column switches $C\text{-}SWL_o$-$C\text{-}SWL_n$. Each unit column switch has the same construction, though this arrangement is not particularly limitative, and includes MOSFETs in the number corresponding to the number of data lines in the redundancy memory array R-ARY1 and in the unit memory array. In other words, one unit column switch in this embodiment includes 16 MOSFETs. The gates of the MOSFETs forming the unit column switch are connected in common.

The complementary data line pairs in the redundancy memory array R-ARY1 and in the unit memory arrays $UMA_l$-$UMA_n$ are connected to the corresponding common complementary data lines through the MOSFETs in the corresponding unit column switches $C\text{-}SWL_o$, $C\text{-}SWL_l$-$C\text{-}SWL_n$. In the drawing, only the redundancy memory array R-ARY1 and the corresponding unit column switch (redundancy column switch) C-SWL are shown in detail. In this embodiment, each unit memory array $UMA_l$-$UMA_n$ and each unit column switch $C\text{-}SWL_l$-$C\text{-}SWL_n$ have the same construction as the redundancy memory array R-ARY1 and the redundancy column switch $C\text{-}SWL_o$, respectively. However, 16 MOSFETs $Q_{51}$-$Q_{516}$ forming the redundancy column switch (unit column switch) $C\text{-}SWL_o$ corresponding to the redundancy memory array R-ARY1 are subjected to switch control by the output signals L from the change-over circuit COC, while 16 MOSFETs forming each of the unit column switches $C\text{-}SWL_l$ to $C\text{-}SWL_m$, which are respectively disposed so as to correspond to the unit memory arrays $UMA_l$-$UMA_m$, are subjected to switch control by the selection signals from the column decoder C-DCR.

The input terminal of a main amplifier is connected to each common complementary data line pair. Accordingly, eight main amplifiers are disposed in this embodiment. These main amplifiers are altogether represented by "main amplifier MA1" for simplification.

The construction of the memory cell and the like in detail will be described later with reference to FIG. 2.

According to the construction described above, the desired 8-bit memory cell can be selected from one desired unit memory array by applying the external address signals RAD and CAD to the dynamic RAM. In other words, it is possible to select such a memory cell, among a plurality of memory cells connected to the word line selected by the row decoder R-DCR, which is connected to the complementary data line of the unit column switch selected by the column decoder C-DCR or by the change-over circuit. Here, the term "selection of unit column switch" means that the MOSFETs forming the unit column switch are turned on by the selection signals from the column decoder C-DCR or by the output signals from the changeover circuit COC.

Though the construction on the left side of FIG. 1 has been described, the right side also preferably has the same construction.

In operation, if any defective memory cell exists in the unit memory array UMA1, for example, the unit column switch $C\text{-}SWL_l$ corresponding to this unit memory array $UMA_1$ is not selected by the column decoder C-DCR1. Instead, the unit column switch $C\text{-}SWL_o$ for the left redundancy memory array R-ARY1 or the unit column switch $C\text{-}SWR_o$ (not shown) disposed so as to correspond to the right redundancy memory array R-ARY2 is selected, as will be later explained in detail. In other words, if any defect exists in the memory cell or the like, selection of the unit memory array including that memory cell is no longer made. Instead, selection is changed over to the redundancy memory array R-ARY1 or R-ARY2.

Next, the present invention will be explained in further detail with reference to FIG. 2. For ease of comprehension, the memory array M-ARY1, the redundancy memory array R-ARY1 and the like are shown for only one of the complementary data line pairs. In FIG. 2, there is shown a definite example of the memory array (including the redundancy memory array) and its selection circuit on one side (left side). It should be noted, however, that for convenience in illustration, the arrangement of the elements in FIG. 2 has been rotated relative to FIGS. 1 and 6 so that the column decoder is to the right of the memory array (rather than below it) and the sense amplifiers are to the left of the memory array (rather than above it). By virtue of this rotation, the complementary data lines such as D and $\overline{D}$ now are in the transverse direction (i.e. left to right) of the memory array, while the word lines will run in the longitudinal direction of the array.

The dynamic RAM shown in the drawing has a memory capacity of about 256K bits (256×1,024=262,144 bits), though this value is not limitative in particular. Since it is of the byte construction, the address signal RAD consists of 8 bits of address signals $A_o$ through $A_7$ while the address signal CAD consists of 7 bits of address signals $A_8$ through $A_{14}$. The address signal $a_9$ is one that corresponds to the highest order address signal $a_{n-1}$, though it is not limitative, in particular.

A pair of rows of the memory array M-ARY 1 are illustrated as the representative and the input and output nodes of the memory cell consisting of switching MOSFETs Q15 through Q19 and an MOS capacitance are connected to a complementary data line pair D, $\overline{D}$ with predetermined regularity as shown in the drawing.

As represented by an MOSFET Q14, the precharge circuit PC1 consists of a switch MOSFET interposed between the complementary data line pairs D, $\overline{D}$.

The sense amplifier SA consists of a CMOS (complementary type MOS) latch circuit which in turn consists of p-channel MOSFETs Q7, Q9 and n-channel MOSFETs Q6, Q8, for example. The pair of input and output nodes of the latch circuit are connected to the complementary data line pairs D, $\overline{D}$ described above. A power source voltage $V_{cc}$ is applied to the latch circuit through parallel p-channel MOSFETs Q12, Q13, though not particularly limitative, and a ground voltage $V_{ss}$ of the circuit is also applied through parallel n-channel MOSFETs Q10, Q11. These power switches MOSFETs Q10, Q11 and Q12, Q13 are used in common for the sense amplifiers SA disposed for the similar rows.

Complementary timing signals $\phi_{pa1}$, $\overline{\phi}_{pa1}$ from the control signal generator TG for activating the sense amplifiers SA are applied to the gates of MOSFETs Q10, Q12 and complementary timing signals $\phi_{pa2}$, $\overline{\phi}_{pa2}$ from the generator TG which are more delayed than the timing signals $\phi_{pa1}$, $\overline{\phi}_{pa1}$ are applied to the MOSFETs Q11, Q13. This arrangement is employed in order to limit the current by MOSFETs Q10, Q12 having a relatively low conductance and thus to prevent the drop of the level of the data lines when the sense amplifiers are operated by the delicate read voltage from the memory cells. After the potential difference between the complementary data lines is expanded by the amplifying operation of the sense amplifiers SA, MOSFETs Q11, Q13 having a relatively large conductance are turned on to speed up their amplifying operation. Thus, the high speed read operation is carried out while preventing the drop of the high level of the complementary data lines by dividing the amplifying operation of the sense amplifiers into two stages.

Only one circuit portion (for four word lines) of the row decoder R-DCR is shown as representative for simplification of the drawing. For example, the word line selecting signal for the four word lines is generated by a NAND circuit of a CMOS type consisting of n-channel MOSFETs Q32-Q36 receiving the address signals $\overline{a2}$-$\overline{a6}$ and p-channel MOSFETs Q37-Q41.

The output of this NAND circuit is inverted by a CMOS inverter IV1 and is then transmitted to the gates of MOSFETs Q24-Q27 through MOSFETs Q28-Q31.

Four kinds of word line selection timing signals $\phi_{x00}$ through $\phi_{x11}$ consisting of the combination of the decoded signals obtained by decoding the address signals $a_o$, $a_1$ and the word line selecting timing signals $\phi_x$ are transmitted to each word line through MOSFETs Q24-Q27 described above.

To fix the word lines to the ground potential at the time of non-selection, MOSFETs Q20-Q23 are disposed between each word line and the ground potential terminal of the circuit and the output signal of the NAND circuit is applied to their gates.

Resetting MOSFETs $Q_o$-$Q_5$ are disposed for each word line. When reset signals $\phi_{pw}$ are applied, these resetting MOSFETs are turned on and the potential of the selected word line is reset to the ground potential of the circuit which is the non-selection potential with respect to the memory cells. These reset signals $\phi_{pw}$ are generated from the signal generator TG (not snown).

As represented by MOSFETs Q42 and Q43, the column switch C-SW selectively couples the complementary data lines D, $\overline{D}$ to the common complementary data lines CD, $\overline{CD}$. The selection signal from the column decoder C-DCR is applied to the gates of these MOSFETs Q42, Q43.

A precharge MOSFET Q44 similar to MOSFET Q14 described above is interposed between the common complementary data lines CD and $\overline{CD}$. A pair of input and output nodes of the main amplifier MA, having the same circuit construction as the sense amplifier SA, are connected to these common complementary data lines CD, $\overline{CD}$. The input-output circuit I/0 consists of the data input buffer DIB and a data output buffer DOB. These input and output buffers are operated complementarily by the timing signals $\phi_{rw}$, $\overline{\phi}_{rw}$, though this arrangement is not particularly limitative.

As the redundancy memory array in this embodiment, two word lines (R-ARY1') for the spare row and eight pairs of complementary data line pairs (R-ARY1) for the spare column are disposed, though this is not particularly limitative. MOSFETs Q47-Q50 are disposed to select these two word lines and MOSFETs Q45 and Q46 are disposed to select a pair of complementary data line pair as the representative pair of the eight sets of the complementary data line pairs described above.

The memory array (including redundancy memory array) M-ARY2 and its selection circuit on the other side (right side) are constructed in the same way as described above.

In this embodiment, two sets (RC1, RC2) of the redundancy circuits are disposed for the spare columns, though not particularly limitative. The change-over circuit COC is disposed in order to select either the redundancy memory array R-ARY1 or R-ARY2 in accordance with the defective address detection signals ACL, ACR from these two redundancy circuits RC1, RC2. The change-over circuit COC generates those timing signals $\phi_{maL}$, $\phi_{maR}$ which make the main amplifier MA1 or MA2 selectively operative, the main amplifier corresponding to the selection signals L or R for the redundancy memory array R-ARY1 or R-ARY2 and to the redundancy memory array R-ARY1 or R-ARY2 selected by the selecting signal L or R.

Figure 3:
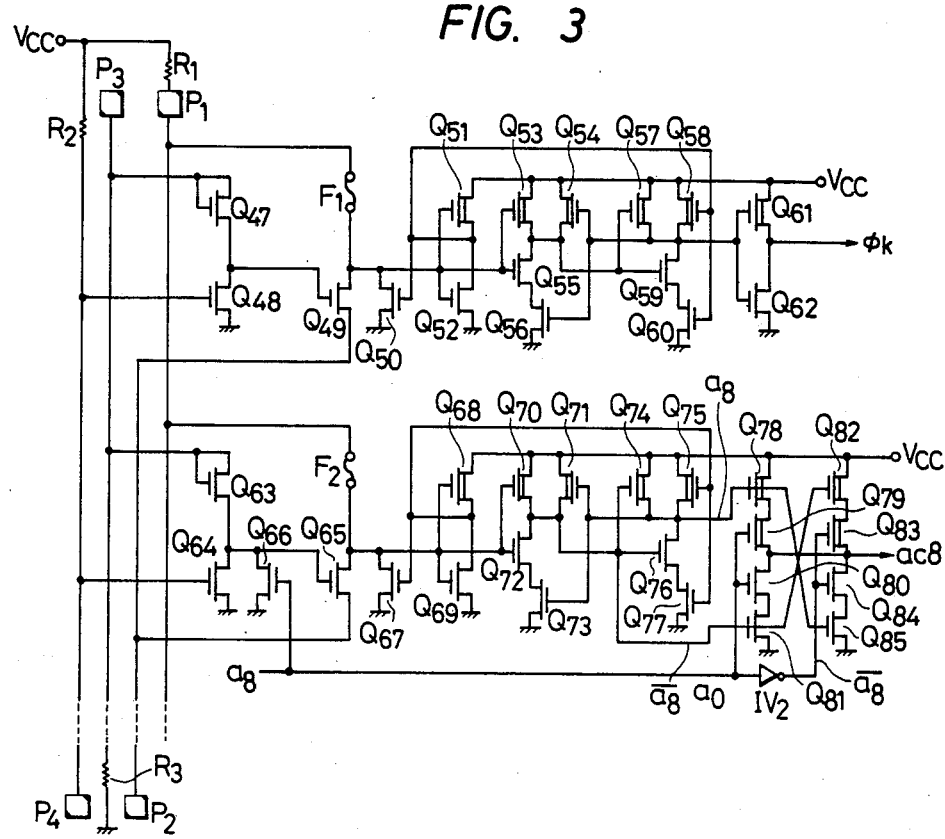
FIG. 3 is a circuit diagram showing an example of a redundancy circuit used in the present invention.

FIG. 3 is a circuit diagram showing an example of the redundancy circuit described above.

Though not limitative, one set of the redundancy circuits consists of memory circuits, in the number corresponding to the bit number of address signals, into which the defective address signals are written, along with address comparison circuits in the same number as the memory circuits and one enable circuit.

In the drawing, one memory circuit for storing one defective address signal, one address comparison circuit and one enable circuit are illustrated.

Terminals P1 through P4 are program voltage feed terminals for writing the defective address signals. The defective address signals can be determined by well known testing procedures. When writing the predetermined defective address signals, a power source voltage $V_{cc}$ is applied to the terminals P1, P3 and the ground potential of the circuit is applied to the terminals P2, P4.

The enable circuit consists of the following circuit elements. Load MOSFETs Q47 and driving MOSFET Q48 form an inverter and the drain and gate of the load MOSFET Q47 are connected to the terminal P3. The output node of this inverter is connected to the gate of a driving MOSFET Q49 for fusing a fuse F1. The fuse F1 is interposed between the drain of this MOSFET Q49 and the terminal P1 and its source is connected to the terminal P2. The gate of MOSFET Q48 is connected to the terminal P4. A resistor R2 is interposed between the terminal P4 and the power voltage $V_{cc}$. The fuse F1 is made of polysilicon, though it is not particularly limited thereto. When the predetermined defective address signals are written, the power voltage $V_{cc}$ is applied to the terminals P1, P3 and the ground potential of the circuit is applied to the terminals P2, P4. Accordingly, the driving MOSFET Q49 is turned on, a current flows through the fuse F1 and the fuse is cut off.

The following CMOS inverter and latch circuits are disposed in order to judge whether or not the fuse F1 is fused.

One of the CMOS NAND gates consists of p-channel MOSFETs Q53, Q54 and n-channel MOSFETs Q55, Q56 while the other consists of p-channel MOSFETs Q57, Q58 and n-channel MOSFETs Q59, Q60. The output node of one of the NAND gates is connected to the input node of the other and vice versa, thereby forming a latch circuit.

In other words, the output node of one of the NAND gates is connected to the input node of the other and the output node of the other is connected to the input node of one of the NAND gates, forming the latch circuit.

The output signals taken out from the drain of the MOSFET Q49 described above is transmitted to the input node of the CMOS inverter consisting of a p-channel MOSFET Q51 and an n-channel MOSFET Q52 and to the gates of MOSFETs Q53 and Q55 as the other input node of one of the NAND gates that form the latch circuit described above. The output signals of the CMOS inverter are applied to the gates of MOSFETs Q58, Q60 as the other input node of the other NAND gate forming the latch circuit and to the gate of MOSFET Q50 which is juxtaposed in parallel with the driving MOSFET Q49.

An enable signal is produced when the output signal of the other NAND gate is passed through the CMOS inverter consisting of a p-channel MOSFET Q61 and an n-channel MOSFET Q62. In other words, the enable signal $\phi_k$ is formed by inverting the output signal of the other NAND gate.

In the same way as the enable circuit described above, the memory circuit into which the defective address signals are written includes an inverter which in turn consists of MOSFETs Q63, Q64, a fuse F2 and a driving MOSFET Q65. The memory circuit further includes an MOSFET Q66 which is disposed in parallel with the driving MOSFET Q65 in order to receive the internal address signal (e.g., the internal address signal $a_8$ in the drawing) to enable writing of the defective address signals.

When writing the predetermined defective address signals, the power voltage $V_{cc}$ is applied to the terminals P1, P3 and the ground potential of the circuit, to the terminals P2, P4.

Next, a writing operation of the internal address signals for designating the defective data lines, that is, the internal address signals $a_8$–$a_{14}$, though not limitative, for the defective address signals, will be explained.

N-bit (7-bit in this embodiment) internal address signals are necessary in order to select a unit memory array including the defective data line pairs from a plurality of unit memory arrays. These internal address signals are written as the defective address signals into the memory circuit described above. To facilitate understanding, only the internal address signal $a_8$ among the internal address signals designating the unit memory array including the defective data line pairs, that is, defective address signal $a_8$, will be explained but the described operation holds true also for the other defective address signals.

Among the defective address signals designating the unit memory array including the defective data line pair, if the defective address signal $a_8$ is at the high level, the MOSFET Q66 is turned on in response to the high level while the driving MOSFET Q65 is turned off. Accordingly, the current does not flow through the fuse F2 and the latter is not fused. Among the defective address signals designating the unit memory array including the defective data line pair, when the defective address signal $a_8$ is at the low level, on the other hand, the MOSFET Q66 described above is turned off and the driving MOSFET Q65 is turned on in response to the low level. Accordingly, the current flows through the fuse F2 and fuses the same. In this manner, a write operation to the fuse F2 is effected in accordance with the potential of the defective address signal $a_8$.

A CMOS inverter and latch circuit analogous to the enable circuit described above are disposed in order to judge whether or not the fuse F2 is fused. The CMOS inverter consists of a p-channel MOSFET Q68 and an n-channel MOSFET Q69 and the CMOS latch circuit consists of p-channel MOSFETs Q70, Q71 and Q74, Q75 and n-channel MOSFETs Q72, Q73 and Q76, Q77.

An address comparison circuit consists of p-channel MOSFETs Q78, Q79 and p-channel MOSFETs Q80, Q81 that are connected to the former Q78, Q79 in series, p-channel MOSFETs Q82, Q83 and n-channel MOSFETs Q84, Q85 that are connected to the former Q82, Q83 in series and a CMOS inverter IV2.

The internal address signal $a_8$ is applied to the gates of the MOSFETs Q79, Q80 described above and the inverted signal of $a_8$, which is formed by inverting $a_8$ by the inverter IV2, is applied to the gates of the corresponding MOSFETs Q83, Q84. The defective address signals $a_8$ and $\overline{a_8}$ latched by the CMOS latch circuit are applied to the p-channel MOSFETs and the n-channel MOSFETs in the cross arrangement such as MOSFETs Q78, Q85 and MOSFETs Q81, Q82.

It will be now assumed that the internal address signal $a_8$ of the high level (logic "1") is stored as the defective address signal in the memory circuit; the fuse F2 is not fused in this instance, so that the output signal $a_8$ of the COMS latch circuit is at the high level while $\overline{a_8}$ is at the low level. Accordingly, the n-channel MOSFET Q85 and the p-channel MOSFET Q82 are turned on.

When the external address signals CAD ($A_8$–$A_{14}$) which bring the internal address signal $a_8$ to the low level are applied to the dynamic RAM so as to write or read the data, the p-channel MOSFET Q79 is turned on by the low level internal address signal $a_8$, and the n-channel MOSFET Q84 is turned on by the low level internal address signal $\overline{a_8}$ which is formed by inverting the phase of $a_8$ by the inverter IV2.

In this manner, when the defective address signal written into the memory circuit does not coincide with the internal address signal applied to the address comparison circuit by memory access, the potential of the coincidence signal ac8 from the address comparison circuit is brought to low level (logic "0") by the n-channel MOSFETs Q84, Q85.

When the external address signals CAD ($A_8$–$A_{14}$) which bring the internal address signal a8 to the high level so as to write or read the data are applied to the dynamic RAM, on the other hand, the n-channel MOSFET Q80 is turned on in response to the high level of the internal address signal a8, and p-channel MOSFET Q83 is turned on by the signal $\overline{a8}$ which is formed by inverting the phase of the internal address signal a8 by the inverter IV2.

When the defective address signal written into the memory circuit in advance thus coincides with the internal address signal applied to the address comparison circuit by memory access, the coincidence signal ac8 produced from the address comparison circuit is brought to the high level (logic "1") by the p-channel MOSFETs Q82 and Q83 that are turned on.

Coincidence signals ac8–ac14 ($ac_o$–$ac_{n-1}$) from a plurality of address comparison circuits contained in one redundancy circuit and the enable signals $\phi_k$ from the enable circuits contained in the address comparison circuits are applied to an AND circuit not shown, and this AND circuit produces the defective address detection signal ACL (ACR). Thus, the detection signal ACL (ACR) of the high level (logic "1") is produced when the high level (logic "1") coincidence signals ac8–ac14 are produced from a plurality of address comparison circuits and moreover, when the enable signal $\phi_k$ of the high level (logic "1") is also produced from the enable circuit. If any one of the coincidence signals ac8–ac14 and the enable signals $\phi_K$ is at the low level (logic "0"), on the other hand, the redundancy circuit produces the low level (logic "0") detection signal ACL (ACR). In other words, when the external address signals CAD applied to the dynamic RAM designate the unit memory array containing the defective data line pair, the redundancy circuit produces the detection signal ACL (or ACR) of the logic "1" and when the external address signals CAD designate the unit memory array not containing the defective data line pair, the redundancy circuit produces the detection signal ACL (or ACR) of the logic "0".

Though not limitative, the detection signal ACL (ACR) is also applied to the NOR gate G4 (G3) shown in FIG. 1 as the killer signal for inhibiting the selection of the unit memory array having defect. As described above, when the address signals selecting the defective data line pair are applied to the dynamic RAM, the detection signal ACL (ACR) changes to the high level (logic "1") so that the NOR gate G4 (G3) is closed. Accordingly, the timing signal $\overline{\phi}_{ym}$ is no longer applied as the timing signal $\phi_y$ to the column decoder C-DCR1 (C-DCR2). As a result, the column address decoder C-DCR1 (C-DCR2) no longer produces such a selection signal, that connects the complementary data line pair to the common complementary data line pair, to the column switch C-SW1 (C-SW2).

The enable circuit described above is disposed in order to prevent the redundancy memory arrays from being selected undesirably. For example, such internal address signals exist for which all the coincidence signals ac8–ac14 become to the high level (logic "1") even if no defective data line pair exist. Unless this enable circuit is disposed, therefore, the redundancy memory arrays will be undesirably selected. When the address signals are written into the memory circuit, the enable circuit automatically produces the enable signal of the high level (logic "1"). On the other hand, the enable circuit will produce the enable signal of the low level (logic "0") when writing is not effected. For this reason, AND operation is effected between the coincidence signals ac8–ac14 and the enable signal and selection and nonselection of the redundancy memory arrays are effected on the basis of the resulting detection signals. Thus, it is possible to prevent the redundancy memory arrays from being selected undesirably.

The other redundancy circuit is formed in the same way as the redundancy circuit described above.

Figure 4:
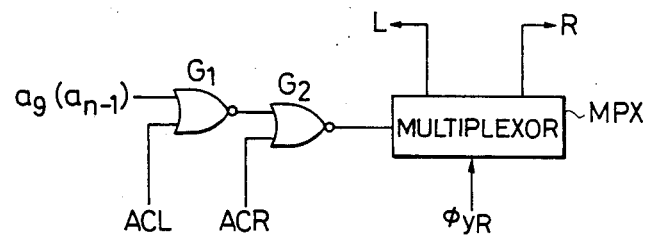
FIG. 4 is a circuit diagram showing an example of a change-over circuit used in the present invention.

FIG. 4 is a circuit diagram showing an example of the change-over circuit COC.

The NOR gate G1 receives the internal address signals determining which memory cells are to be selected from either one of the memory arrays M-ARY1 and M-ARY2 among a plurality of internal address signals applied to the column address decoder, that is, the internal address signal a9 in this embodiment ($a_{n-1}$ in the embodiment shown in FIG. 1), though not limitative. Gate $G_1$ also receives the detection signal ACL from the redundancy circuit RC1 disposed for the left redundancy memory array R-ARY1. The output of this NOR gate G1 and the detection signal ACR from the redundancy circuit RC2 disposed for the right redundancy memory array R-ARY2 are applied to the NOR gate G2. The output signal of this NOR gate G2 is used as a change-over control signal for a multiplexor.

The multiplexor alternatively delivers the selection timing signal $\phi_{YR}$ as the selection signal L or R on the basis of the output signal of the NOR gate G2. The selection signal L is applied to the unit (redundancy) column switch disposed for the left redundancy memory array R-ARY1 while the selection signal R is applied to the unit (redundancy) column switch disposed for the right redundancy memory array R-ARY2. The right and left redundancy memory arrays R-ARY1 and R-ARY2 are selectively selected by these selection signals L and R.

When the output signal of the NOR gate G2 is at the high level (logic "1"), the multiplexor is arranged to produce the timing signal $\phi_{YR}$ as the selection signal L, though this arrangement is not particularly limitative. When the output signal of the NOR gate G2 is at the low level (logic "0"), on the contrary, the multiplexor is arranged to produce the timing signal $\phi_{YR}$ as the selection signal R.

In this embodiment, when the address signal a9 ($a_{n-1}$) is at the high level (logic "1"), the memory cells are selected from the left memory array M-ARY1 and when the address signal a9 ($a_{n-1}$) is at the low level (logic "0"), they are selected from the right memory array M-ARY2, though the arrangement is not particularly limitative, either.

Figure 8:
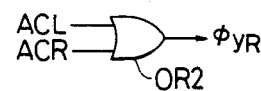
FIG. 8 is a circuit diagram showing an example of a generation circuit generating selection timing signals $\phi_{YR}$.

As shown in FIG. 8, the selection timing signal $\phi_{YR}$ is formed by the OR circuit OR2 which receives the detection signals ACL and ACR. Only when the external address signal which selects the defective data line pair is applied to the dynamic RAM are these detection signals formed by the redundancy circuits. Therefore, the timing signal generation circuit $\phi_{YR}$ consisting of this OR circuit forms the timing signal $\phi_{YR}$ only when the address signals which select the defective data line pair are applied to the dynamic RAM. Thus, selection of the redundancy memory array at an undesirable time can be prevented.

A multiplexor analogous to the multiplexor MPX described above for FIG. 4 forms the operation timing signals $\phi_{maL}$, $\phi_{maR}$ for the main amplifiers MA1, MA2 (not shown).

In other words, when the output signal of the NOR gate G2 described above is at the high level, this multiplexor produces the timing signal $\phi_{ma}$ for activating the main amplifiers as the operation timing signal $\phi_{maL}$ for the main amplifier MA1 disposed on the left. When the output signal of the NOR gate G2 is at the low level, on the other hand, the multiplexor produces the timing signal $\phi_{ma}$ as the operation timing signal $\phi_{maR}$ for the main amplifier MA2 disposed on the right.

In order to enhance the read operation speed, the main amplifier MA1 (MA2) in this embodiment is arranged to operate over two stages in the same way as the sense amplifier described earlier, though the arrangement is not particularly limitative. Accordingly, when the operation timing signal $\phi_{maL}$ ($\phi_{maR}$) is produced, a timing generation circuit, not shown, produces a timing signal $\phi_{maL1}$ ($\phi_{maR1}$) corresponding to the timing signal $\phi_{pal}$ for the sense amplifier, a timing signal $\overline{\phi_{maL1}}$ ($\overline{\phi_{maR1}}$) as the phase inverted signal of the former, a timing signal $\phi_{maL2}$ ($\phi_{maR2}$) corresponding to the timing signal $\phi_{pa2}$ to the sense amplifier and a timing signal $\overline{\phi_{maL2}}$ ($\overline{\phi_{maR2}}$) as the phase inverted signal of the former, on the basis of the operation timing signal $\phi_{maL}$ ($\phi_{maR}$) described above. When the memory cells are selected from the memory array M-ARY1 or redundancy memory array R-ARY1 disposed on the left, therefore, the main amplifier MA1 on the left is operated and when the memory cells are selected from the memory array M-ARY2 or redundancy memory array R-ARY2 disposed on the right, the main amplifier MA2 on the right is operated.

Next, the operation of this embodiment will be described.

When the memory array M-ARY1 on the left contains the defective data line pair and the internal address signals designating this defective data line pair are stored in advance in the memory circuits of the redundancy circuit RC1 disposed for the memory array M-ARY1 on the left, the redundancy circuit RC1 produces the high level (logic "1") detection signal ACL when the external address signals selecting such a defective data line pair are applied to the dynamic RAM. In this case, the external address is such an address signal that selects the memory cells from the memory array M-ARY1 on the left and hence, the internal address signal $a_9$ is at the high level (logic "1"). Since the redundancy circuit RC2 produces the low level (logic "0") detection signal ACR, the output signal of the NOR gate G2 changes to the high level, so that the multiplexor MPX applies the selection signal L to the unit column switch C-SW$_{Lo}$ disposed for the left redundancy memory array R-ARY1. In other words, the timing signal $\phi_{yR}$ is applied to the unit column switch C-SWL$_o$. As a result, the defective data line pair in the memory array M-ARY1 on the left is changed over to the spare (redundancy) data line pair disposed likewise on the left. This means that the spare data line pair disposed on the left is selected instead of the data line pair in the memory array M-ARY1 on the left.

If the defective data line pair is contained in the memory array M-ARY2 on the right and the internal address signals designating this defective data line pair are stored in advance in the memory circuits of the redundancy circuit RC2 disposed for the memory array M-ARY2 on the right, the redundancy circuit RC2 produces the high level (logic "1") detection signal ACR when the external address signals that select such a defective data line pair are applied to the dynamic RAM. In this case, the external address signals are those address signals which select the memory cells from the memory array M-ARY2 on the right, so that the internal address signal $a_9$ is the low level (logic "0") signal. The redundancy circuit RC1 produces the low level detection signal ACL. Accordingly, the NOR gate G1 forms the high level (logic "1") output signal, and the output signal of the NOR gate G2 becomes a low level signal (logic "0"). In response thereto, the multiplexor MPX delivers the selection signal R to the unit column switch C-SWR$_o$ disposed for the redundancy memory array R-ARY2 on the right. In other words, the selection timing signal $\phi_{yR}$ is applied to the unit column switch C-SWR$_o$. As a result, the spare data line pair on the right is selected instead of the defective data line pair in the memory array M-ARY2 on the right.

Next, it will be assumed that the memory array M-ARY2 on the right contains the defective data line pair and this defective data line pair is stored in advance in the memory circuits of the redundancy circuit RC1 disposed for the memory array M-ARY1 for the left. If the external address signals selecting such a defective data line pair are applied to the dynamic RAM in this case, the redundancy circuit RC1 produces the high level detection signal ACL when the external address signals selecting such a defective data line pair are applied to the dynamic RAM. Since the external address signals in this case are those address signals which select the memory cells from the memory array M-ARY2 on the right, the internal address signal $a_9$ is at the low level. Accordingly, the NOR gate G1 produces the low level output signal. The redundancy circuit RC2 produces the low level (logic "0") detection signal ACR. Accordingly, the output signal of the NOR gate G2 is at the high level and the multiplexor MPX delivers the selection signal L (selection timing signal $\phi_{yR}$) to the unit column switch C-SWL$_o$ disposed for the redundancy memory array R-ARY1 on the left in response thereto. As a result, the defective data line pair in the memory array M-ARY2 disposed on the right is changed over to the spare data line pair disposed on the left. In other words, the spare data line pair disposed on the left is selected in place of the defective data line pair disposed on the right.

If the memory array M-ARY1 on the left contains the defective data line pair and the internal address signals designating this defective data line pair are stored in advance in the memory circuits of the redundancy circuit RC2 disposed for the memory array M-ARY2 on the right, the redundancy circuit RC2 produces the high level detection signal ACR when the external address signals selecting such a defective data line pair are applied to the dynamic RAM. In this case, since the external address signals are those address signals which select the memory cells from the memory array M-ARY1 on the left, the internal address signal $a_9$ is at the high level (logic "1"). The redundancy circuit RC1 produces the low level (logic "0") detection signal ACL. Accordingly, the output signal of the NOR gate G1 becomes the low level (logic "0") signal while the output signal of the NOR gate G2 becomes also the low level signal. Hence, the multiplexor MPX delivers the selection signal R (selection timing signal $\phi_{yR}$) to the unit column switch C-SWR$_o$ disposed for the redundancy memory array R-ARY2 on the right. As a result, the defective data line pair in the memory array M-ARY1 disposed on the left is changed over to the spare data line pair disposed on the right. In other words, the spare data line pair disposed on the left is selected instead of the defective data line pair disposed on the right.

In this manner, the right and left redundancy memory arrays R-ARY1, R-ARY2 can be selected freely by these two redundancy circuits.

For the reason noted above, the right and left spare data lines can be selected in place of the two data lines even if such two fail data lines are contained in the same memory array M-ARY1 or M-ARY2. Thus, it becomes possible to effectively use the spare data lines and to enhance the relief ratio of the fail bits.

In other words, even if two memory arrays having the defect exist in the same memory array, it is possible to relieve the defect by alloting them one by one to the right and left redundancy memory arrays. In this manner, the relief ratio of the fail bits can be enhanced and the yield of products can be drastically improved.

When the defective address signals are not stored in the memory circuits of the redundancy circuits RC1 and RC2, the low level detection signals ACL and ACR are produced from these circuits, respectively. Accordingly, the NOR gate G2 produces the output signal in accordance with the address signals $a_9$ ($a_{n-1}$) at that time. Accordingly, when the address signals CAD selecting the memory cells from the memory array M-ARY1 on the right are applied to the dynamic RAM during the read operation, the changeover circuit COC produces the operation timing signals $\phi_{maL1}$, $\overline{\phi_{maL1}}$, $\phi_{maL2}$, $\overline{\phi_{maL2}}$ to the main amplifier MA1 on the left and when the address signals CAD selecting the memory cells from the memory array M-ARY2 on the right are applied to the dynamic RAM, the change-over circuit COC produces the operation timing signals $\phi_{maR1}$, $\overline{\phi_{maR1}}$, $\phi_{maR2}$, $\overline{\phi_{maR2}}$ to the main amplifiers MA2 on the right. In other words, the main amplifiers MA1 and MA2 are selectively operated in this case, too.

In this embodiment, change-over to the redundancy memory arrays can be effected using the fuse means so that the test efficiency and cost can be reduced. Since a plurality of mutually adjacent word lines are selected by the address decoder circuit consisting of one logic gate circuit, it is not necessary to divide into two stages the arrangement gap (pitch) in the transverse direction having a relatively large area for forming the address decoder circuit but it is possible to match this pitch with the arrangement pitch of a plurality of word lines. Hence, the occurrence of useless void portions inside the chip can be prevented.

The memory arrays in this embodiment merely short-circuit the complementary data line pairs (common complementary data line pairs) so as to precharge the complementary data lines (common complementary data lines) to an intermediate level of approximately half of $V_{cc}$ ($V_{cc}/2$). In comparison with the type of array in which precharge is effected from 0 volt to the $V_{cc}$ level, therefore, the level change is smaller in this embodiment and the gate voltage of the precharge MOSFET can be sufficiently turned on even by use of the ordinary logic level ($V_{cc}$) under the non-saturated state. Hence, the speed of the precharge operation is increased with reduced power consumption.

Since the precharge level is set to the intermediate level of approximately half of $V_{cc}$ as described above, the gate voltage (word line selection voltage) of the switch MOSFET of the memory cell can be sufficiently turned on under the non-saturated state even by use of the ordinary logic level ($V_{cc}$) at the time of read of the memory cells. Therefore, full charge read of data storage capacitors can be made without using the boot strap voltage that has been necessary in the conventional dynamic type RAM.

The precharge level of one of the data lines for which the memory cells are not selected is used as the read reference voltage and hence, dummy cells that have been necessary for the conventional dynamic type RAM to generate the read reference voltage are not necessary in this embodiment.

Figure 7:
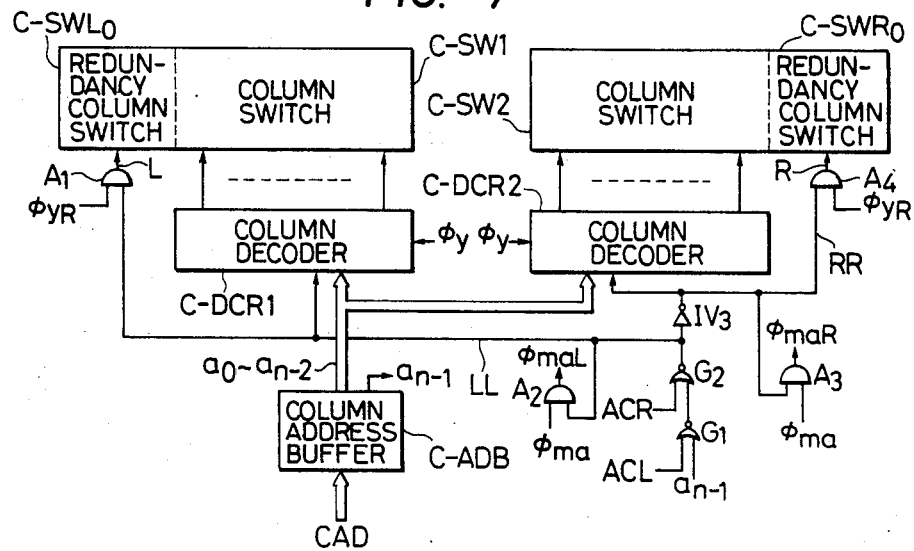
FIG. 7 is a circuit diagram showing another embodiment of the present invention.

FIG. 7 is a circuit diagram of the logic circuit in accordance with another embodiment of the present invention.

The column switches and column address decoders that will be described have the same construction as those of the embodiment shown in FIG. 1, though they are not limitative, in particular.

In the drawing, C-SW1 and C-SW2 represent the column switches which include redundancy column switches C-SWL$_o$ and C-SWR$_o$ for the redundancy memory arrays, respectively. Though not shown in the drawing, the redundancy column switch C-SW1 (C-SW2) and the redundancy column switch C-SWL$_o$ (C-SWR$_0$) inside the former are column switches for the memory array and redundancy memory arrays shown on the right side (left side) of FIG. 1.

Though not shown in the drawing, the address decoder R-DCR is interposed between the memory arrays in the same way as in FIG. 1. Common word lines are formed for the two memory arrays and two redundancy memory arrays described above in such a manner that the selection signals from the address decoder R-DCR are supplied to these word lines. The main circuit blocks in the drawing are illustrated in match with the geometric arrangement in the practical semiconductor integrated circuit in the same way as in FIG. 1.

Among the column switches C-SW1(C-SW2), the rest of column switches other than the redundancy column switch C-SWL$_o$ (C-SWR$_o$) are controlled by the selection signals from the corresponding column address decoder C-DCR1 (C-DCR2). Thus, the column switches connect eight sets of complementary data line pairs among a plurality of complementary data line pairs formed in the memory arrays to the corresponding eight sets of common complementary data line pairs.

The column address decoder C-DCR1 (C-DCR2) receives the complementary internal address signals $\underline{a_o\text{-}a_{n-2}}$ and the selection signal LL (RR) from the change-over circuit COC (described hereinafter) and forms the selection signals to the column switches in accordance with the complementary internal address signals and the selection signal LL (RR). In other words, the column address decoder decodes the complementary internal address signal and the selection signal LL (RR) and forms the selection signals to the column switches. The operation of the column address decoder C-DCR1 (C-DCR2) is controlled by the timing signal $\phi_y$ that is formed on the basis of the selection timing signal $\overline{\phi_{ym}}$ and the killer signal $\phi_{KL}$ ($\phi_{KR}$) as described earlier with regard to FIG. 1, though not limited thereto.

C-ADB represents a column address buffer, which receives the external address signals, forms the complementary internal address signals $\underline{a_o\text{-}a_{n-2}}$ as well as the internal address signal $a_{n-1}$ and delivers the complementary address signals $a_0$–$a_{n-2}$ to the column address decoders C-DCR1 and C-DCR2.

The internal address signal $a_{n-1}$ is an address signal which decides whether the memory cells are selected from the memory array on the left or on the right. In this embodiment, the internal address signal $a_{n-1}$ is the highest order address signal. When it is at the high level (logic "1"), for example, the memory cells are selected from the memory array on the left and when it is at the low level (logic "0"), on the contrary, the memory cells are selected from the memory array on the right.

The change-over circuit COC consists of NOR gates $G_1$, $G_2$, AND gates $A_1$–$A_4$ and an inverter $IV_3$.

The address signal $a_{n-1}$ and the detection signals ACL, ACR from the redundancy circuit RC1, RC2 are applied to the NOR gates $G_1$, $G_2$ in the same way as the NOR gates $G_1$, $G_2$ shown in FIG. 4. The AND gate $A_2$ receives the output signal (selection signal LL) of the NOR gate $G_2$ and the timing signal $\phi_{ma}$ for activating the main amplifier and forms the timing signal $\phi_{maL}$ for activating the main amplifiers MA1 connected to the common complementary data line pairs disposed on the left. The AND gate $A_1$ receives the selection signal LL and the selection timing signals $\phi_{yR}$ of the redundancy memory arrays described with reference to FIG. 8, for example, and forms the selection signal L for the redundancy column switch C-SWL$_o$ disposed for the redundancy memory array on the left.

The output signal of the NOR gate $G_2$ is applied to the inverter $IV_3$. The AND gate $A_3$ receives the selection signal RR formed by this inverter $IV_3$ and the timing signal $\phi_{ma}$ described above and forms the timing signal $\phi_{maR}$ for activating the main amplifiers MA2 connected to the common complementary data line pairs disposed on the right. The AND gate $A_4$ receives the selection signal RR and the selection timing signal $\phi_{yR}$ and forms the selection signal R for the redundancy column switch C-SWR$_o$ disposed on the redundancy memory array on the right.

According to the construction described above, it is possible to change over and use the right and left redundancy memory arrays using a relatively small number of elements. It is also possible to select the right and left memory arrays by use of the selection signals formed by the change-over circuit COC.

When the right and left redundancy memory arrays are not used, the output signals ACL and ACR of the redundancy circuits RC1, RC2 are at the low level (logic "0") as described above. The logic value of the selection signal LL as the output signal of the NOR gate $G_2$ is the same as the logic value of the address signal $a_{n-1}$ which determines which of the right and left memory arrays are to be selected. For this reason, when the logic value of the address signal $a_{n-1}$ is "1" to select the memory array on the left, the logic value of the selection signal LL becomes also "1", whereby the column address decoder C-DCR1 on the left operates. In the words, the column address decoder C-DCR1 applies the selection signals in accordance with the complementary address signals $a_0$–$a_{n-2}$ to the column switch C-SW1. On the other hand, when the logic value of the address signal $a_{n-1}$ is "0" to select the memory array on the right, the logic value of the selection signal RR becomes "1" because the inverter $IV_3$ is disposed, so that the column address decoder C-DCR2 on the right operates. As a result, the column address decoder C-DCR2 produces the selection signals in accordance with the complementary address signals $a_0$–$a_{n-2}$ to the column switch C-SW2 on the right. Since the logic value of the selection signal RR is "0" when the column address decoder C-DCR1 on the left operates, the column address decoder C-DCR2 does not operate. This also holds true of the column address decoder C-DCR1 on the left when C-DCR2 on the right is operated by the selection signal RR.

As has been explained with reference to FIG. 4, the detection signal ACL or ACR from the redundancy circuit RC1 or RC2 is at the high level (logic "1") when the external address signals that select the defective data line pairs are applied to the dynamic RAM. As a result, when the redundancy memory array on the left is selected, the output signal of the NOR gate $G_2$ is at the high level (logic "1") and when the redundancy memory array on the right is selected, the output signal of the NOR gate $G_2$ is at the low level.

On the other hand, when the detection signal ACL or ACR is at the high level (logic "1"), the selection timing signal $\phi_{yR}$ is at the high level, as has been explained with reference to FIG. 8. Accordingly, when the selection signal LL is at the high level (logic "1") to select the redundancy memory array on the left, the output signal L of the AND gate $A_1$ is at the high level and the redundancy column switch C-SWL$_o$ disposed for the redundancy memory array on the left is selected. On the other hand, when the output signal of the NOR gate $G_2$ is at the low level to select the redundancy memory array on the right, the selection signal RR changes to the high level because the inverter $IV_3$ is disposed. As a result, the AND gate $A_4$ forms the high level output signal R and the redundancy column switch C-SWR$_o$ disposed for the redundancy memory array on the right is selected.

When the redundancy memory arrays are to be selected, the killer signal $\phi_{KL}$ ($\phi_{KR}$) is produced as described earlier. Hence, the NOR gate $G_4$ ($G_3$) shown in FIG. 1 is closed and the selection timing signal $\phi_y$ is no longer supplied to the column address decoder. Accordingly, the column address decoder does not operate. When the redundancy memory arrays are not selected, both detection signals ACL and ACR are at the low level so that no selection timing signal $\phi_{yR}$ is formed. Accordingly, the high level selection signals L, R are not applied to the redundancy column switches C-SWL$_o$, C-SWR$_o$ through the AND gates $A_1$, $A_4$ and the redundancy memory arrays are not selected.

When the memory array on the left or the redundancy memory array on the left is selected, the selection signal LL always remains at the high level (logic "1") so that the AND gate $A_2$ is opened and the timing signal $\phi_{ma}$ is applied to the main amplifiers MA1 on the left as the timing signal $\phi_{maL}$. When the memory array on the right or the redundancy memory array on the right is selected, on the other hand, the selection signal RR remains always at the high level (logic "1") so that the AND gate $A_3$ is opened and the timing signal $\phi_{ma}$ is applied to the main amplifiers MA2 on the right as the timing signal $\phi_{maR}$. In other words, when the memory array on the left or the redundancy memory array on the left is selected, only the main amplifiers MA1 on the left always operate, and when the memory array on the right or the redundancy memory array on the right is selected, only the main amplifiers MA2 on the right always operate. Thus, this embodiment makes it possible to change over the right and left redundancy memory arrays and to select the right and left memory arrays using a relatively small number of elements.

Since this embodiment makes it possible also to selectively operate only either one of the main amplifiers that must be operated, it can reduce the power consumption. Each of the right and left main amplifiers consists of eight main amplifiers as described already with reference to FIGS. 1 and 2.

In this embodiment, the memory circuit in which the defective address signal $a_{n-1}$ is stored and the address comparison circuit for comparing the output signal of this memory circuit with the internal address signal need not be disposed in the redundancy circuits RC1 and RC2.

Figure 9:
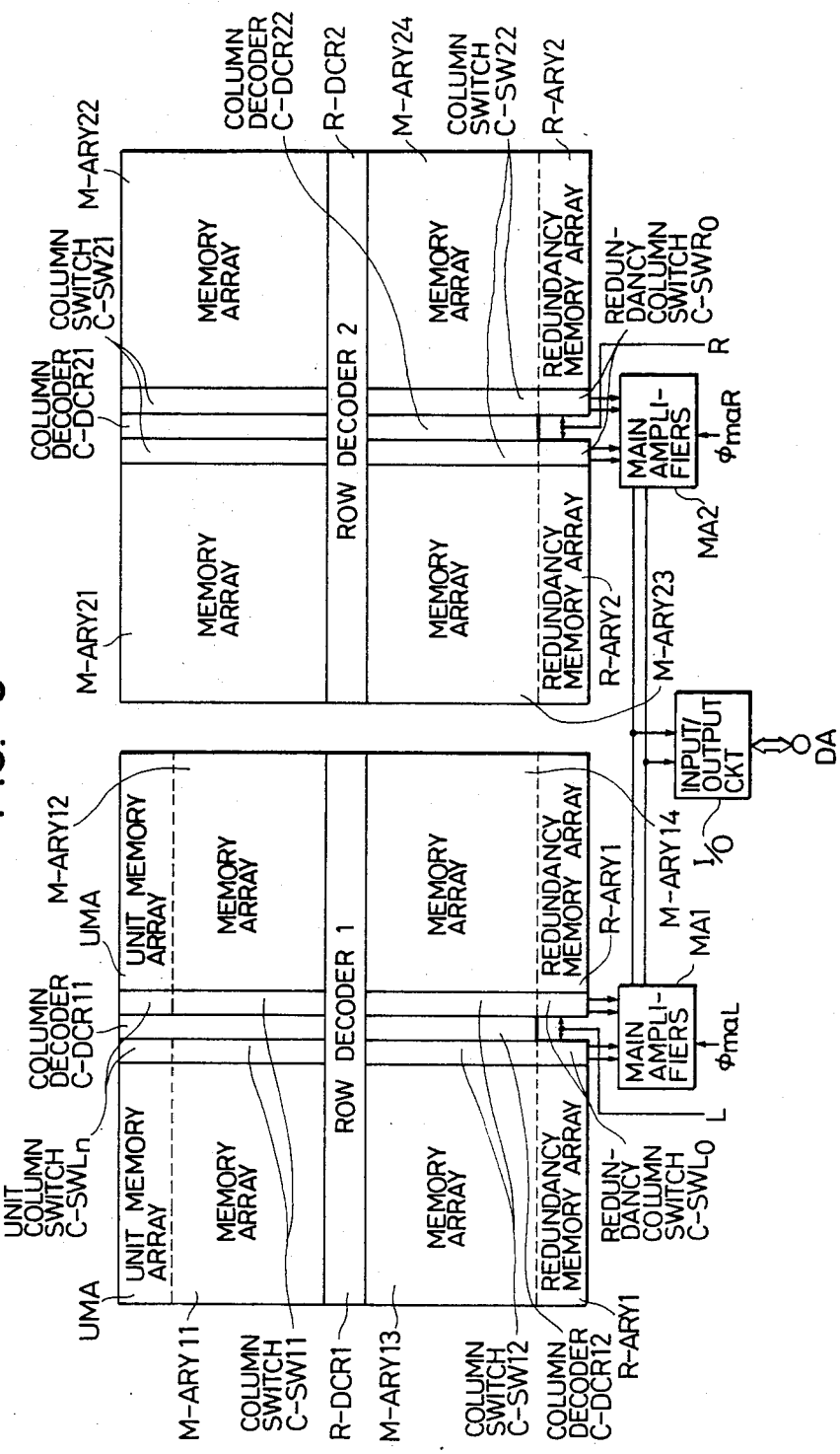
FIG. 9 is a block diagram showing still another embodiment of the present invention.

FIG. 9 shows another example of a dynamic RAM to which this invention is applied.

In the drawing, the main circuit blocks are depicted to match with the geometric arrangement in a practical semiconductor integrated circuit.

In the drawing, M-ARY11 through M-ARY14 shown on the left and M-ARY21 through M-ARY24 shown on the right represent memory arrays, respectively. Each of the memory arrays M-ARY13, M-ARY14 and M-ARY23, M-ARY24 includes spare (redundancy) memory arrays. R-ARY1 shown on the left and R-ARY2 shown on the right are the spare memory arrays. The memory arrays M-ARY13, 14, 23 24 and the memory arrays M-ARY11, 12, 21, 22 other than the spare memory arrays have the same construction.

Each memory array is formed to consist of a plurality of word lines which extend in the longitudinal direction and that are sequentially arranged in the transverse direction, a plurality of complementary data line pairs that are formed to extend in the transverse direction and are sequentially arranged in the longitudinal direction, and a plurality of memory cells that are disposed at the points of intersection between the word lines and the complementary data line pairs in accordance with a predetermined rule.

Each of R-DCR1 and R-DCR2 shown between the memory arrays is a row address decoder which decodes the internal complementary address signals and delivers the selection signals to the word lines. The selection signals produced from the row decoder are applied in common to the word lines of the memory arrays that are arranged vertically with respect to the row decoder. In other words, the word lines that are formed in the vertical direction relative to the row decoder are substantially connected to one another. For example, the word lines in the memory array M-ARY11 and the word lines in the memory array M-ARY13 are substantially connected to one another.

Each of C-SW11, C-SW12 and C-SW21, C-SW22 shown between the two memory arrays is a column switch, which connects a plurality of complementary data line pairs to a plurality of common complementary data lines pairs in accordance with the selection signals from the column decoders.

In the drawing, each of C-DCR-11, C-DCR12, C-DCR21, C-DCR22 shown between pairs of column switches is a column address decoder, which receives the internal complementary address signals, the selection timing signals $\phi_y$ and the selection signal LL (RR) from the change-over circuit, decodes them and forms the selection signals to the column switches.

Eight common complementary data line pairs are disposed for the memory array on the left and eight sets, for the memory array on the right. Each of the common complementary data line pairs is connected to the input-output node of the main amplifier. Accordingly, eight each main amplifiers are disposed for each of the right and left memory arrays. In the drawing, eight main amplifiers disposed on the left are represented by MA1 for simplification and the main amplifiers on the right, by MA2. The operation of the main amplifiers on the left is controlled by the operation timing signals $\phi_{maL}$ and the operation of the main amplifiers on the right, by the timing signals $\phi_{maR}$.

Figure 2:
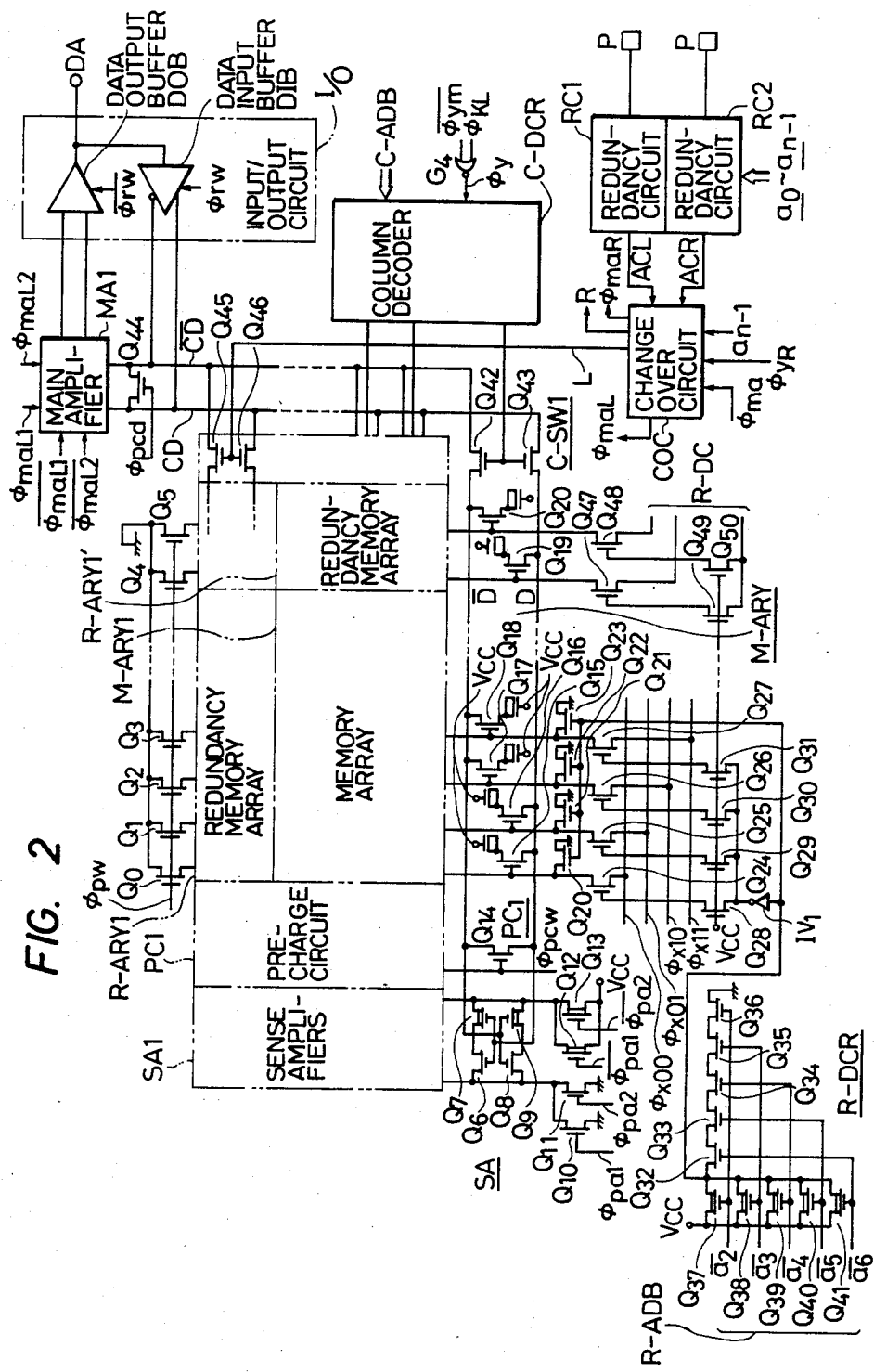
FIG. 2 is a circuit diagram showing a specific example of a part of the embodiment shown in FIG. 1.

The output signals from the main amplifiers MA1 or MA2 are produced via an input-output circuit I/O having the same construction as that shown in FIG. 2.

In the memory of this embodiment, two redundancy circuits having the same construction as that of the circuits in the foregoing embodiment and a change-over circuit (not shown) having the same construction as that shown in FIG. 7 are disposed. In other words, there are disposed the redundancy circuit RC1 for the redundancy memory array R-ARY1 on the left, the redundancy circuit RC2 disposed for the redundancy memory array R-ARY2 on the right and the change-over circuit COC for receiving the detection signals ACL, ACR from these redundancy circuits RC1, RC2. As described with reference to the foregoing embodiment, the selection timing signal $\phi_{yR}$, the timing signals $\phi_{ma}$ for activating the main amplifiers and the predetermined internal address signals $a_{n-1}$ ($a_9$) are applied to the change-over circuit COC besides the detection signals ACL, ACR described above. The change-over circuit COC produces the operation timing signals $\phi_{maL}$, $\phi_{maR}$, the selection signals LL, RR, and the selection signals L, R.

The operation timing signals $\phi_{maL}$ produced from the change-over circuit are applied to the main amplifiers MA1 on the left and the operation timing signals $\phi_{maR}$, to the main amplifiers MA2 on the right. The selection signal LL produced from the change-over circuit is applied to the column decoders C-DCR11, C-DCR12 on the left and the selection signal RR, to the column decoders C-DCR21, C-DCR22 on the right. The selection signal L produced from the change-over circuit COC is applied to the spare (redundancy) column switch C-SWL$_o$ disposed for the spare memory array R-ARY1 on the left and the selection signal R, to the spare (redundancy) column switch C-SWR$_o$ disposed for the spare memory array R-ARY2 on the right.

The dynamic RAM of this embodiment is a memory of a byte construction having a memory capacity of approximately 256K bits. 8-bit external address signals $A_o$–$A_7$ are applied to a row address buffer (not shown) which forms the internal complementary address signals to be applied to the row address decoder R-DCR. 7-bit external address signals $A_8$–$A_{14}$ are applied to a column address buffer (not shown) which forms the internal complementary address signals to be applied to the column address decoder C-DCR.

The input-output nodes of sense amplifiers, not shown, are connected to the complementary data line pairs.

In the memory of this embodiment, the internal address signal $a_9$ is an address signal which decides whether the memory cells are to be selected from the memory arrays M-ARY11 through M-ARY14 on the left or from the memory arrays M-ARY21 through M-ARY24 on the right. For example, when the internal address signal $a_9$ is at the high level (logic "1"), the memory cells are selected from the memory array on the left and when it is at the low level (logic "0"), on the other hand, the memory cells are selected from the memory array on the right. Accordingly, this internal address signal a9 is applied to the change-over circuit described above as the predetermined internal address signal $a_{n-1}$.

The internal address signal $a_{14}$ decides whether the memory cells are selected from the memory arrays M-ARY11, 12, 21, 22 upstream of the row decoders R-DCR1, R-DCR2 or from the memory arrays M-ARY13, 14, 23, 24 downstream of the row decoders. For example, when the internal address signal $a_{14}$ is at the high level (logic "1"), the memory cells are selected from the upstream memory arrays and when it is at the low level (logic "0"), the memory cells are selected from the downstream memory arrays.

In this embodiment, a common multi-bit address is given to four sets of complementary data line pairs that are adjacent to one another in a pair of memory arrays arranged so as to interpose the column decoder between them. In other words, the common multi-bit address is given to four sets of complementary data line pairs adjacent to one another in one of the memory arrays and to four sets of complementary data line pairs adjacent to one another in the other of the memory arrays. This means that a unit memory array consists of four sets of complementary data line pairs in one of the memory arrays, four sets of complementary data line pairs in the other of the memory arrays, a plurality of memory cells connected to these complementary data line pairs and a plurality of word lines connected to the memory cells. The unit memory array UMA is shown as representative of this arrangement in the drawing.

The column switch consists of a plurality of unit column switches. Each unit column switch consists of 16 MOSFETs that are subjected to switch control by the selection signals from the column address decoder in such a manner as to connect eight sets of complementary data line pairs in the unit memory array to the corresponding eight sets of common complementary data line pairs. In the drawing, the unit column switch C-SWL$_n$ disposed for the unit memory array UMA is shown as representative of this unit switching arrangement.

The redundancy memory array R-ARY1 (R-ARY2) consists of four sets of complementary data line pairs that are disposed on the left relative to the column decoder C-DCR12 (C-DCR22) and are adjacent to one another, a plurality of word lines disposed so as to cross the complementary data line pairs, a plurality of memory cells disposed at the points of intersection with a predetermined rule, four sets of complementary data line pairs that are disposed on the right relative to the column decoder C-DCR12 (C-DCR22) and are adjacent to one another, a plurality of word lines arranged so as to cross the complementary data line pairs and a plurality of memory cells arranged at the points of intersection with a predetermined rule. In order to connect eight sets of complementary data line pairs to the corresponding eight sets of common complementary data line pairs, there is also disposed a redundancy column switch C-SWL9 (C-SWR$_o$) consisting of MOSFETs that are subjected to switch control by the selection signal L (R) from the change-over circuit COC.

The explanation in detail of the memory arrays, row decoders, sense amplifiers and the like is omitted with regard to FIG. 9 because they are the same as those in the foregoing embodiment.

The operation of the change-over circuit COC is substantially the same as that of the embodiment shown in FIG. 7. When the defective data lines are contained in the memory arrays M-ARY11 through M-ARY14 on the left (or memory arrays M-ARY21 through M-ARY24 on the right), the change-over circuit COC, if disposed, makes it possible to select the spare memory array R-ARY1 on the left (or the spare memory array on the right) in place of the defective data lines. When the defective data lines are contained in the memory arrays on the left (or the memory arrays on the right), the change-over circuit makes it possible to select the spare memory array on the right (or the spare memory array on the left) in place of the defective data lines.

Since the length of the word lines and that of the data lines can be made shorter in the FIG. 9 arrangement, this embodiment is useful when a very high speed operation is desired.

The present invention is not limited to the foregoing embodiments, in particular.

The numbers of redundancy circuits and redundancy memory arrays may be two or more sets. For instance, two redundancy memory arrays are disposed for each of the right and left memory arrays. In this case, a redundancy circuit is disposed for each redundancy memory array. In other words, four redundancy circuits are disposed in all. Also, a change-over circuit is provided for the redundancy circuit(s) disposed for the left redundancy memory array and for the redundancy circuit(s) disposed for the right redundancy memory array. That is, two change-over circuits are disposed in all in this case. Even if four unit memory arrays containing the defective data lines are formed in either one of the right and left memory arrays, the memory not substantially containing the defective data lines can be obtained by employing the arrangement so that two redundancy memory arrays on the left are selected in place of the two of the four unit memory arrays containing the effective data lines and two redundancy memory arrays on the right are selected in place of the remaining two unit memory arrays.

In most memories now being made the data lines are formed of aluminum while the word lines are formed of polysilicon. In the IC fabrication process, failure of aluminum is more liable to occur than failure of polysilicon. Therefore, the illustrated embodiments have primarily been directed to the replacement of whole data lines. However, the change-over circuit may also be disposed for a redundancy memory array disposed for the row (word line), that is, the spare word lines and the redundancy circuits disposed for the word lines, so as to use the redundancy memory array in common between a plurality of memory arrays in the same way as described above.

The change-over circuit COC for the redundancy memory array can be realized by the combination of extremely simple logic circuits as described above.

However, the definite circuit construction of this change-over circuit is not limited to the above, in particular.

For example, it will be assumed that the positive logic using the logic "1" as the high level is employed in the embodiments described above; if the logic circuits G$_1$, G$_2$ are composed of NOR gates using a CMOS circuit in this case, the high levels of the output signals are formed by a series circuit of p-channel MOSFETs having a relatively low driving capacity. It is therefore preferred to utilize NAND gates by use of inverted signals of each input signal. In such a a case, the p-channel MOSFETs for forming the high level of the output signal can be arranged in the parallel form so that a logic circuit having a large driving capacity can be constituted by relatively small MOSFETs. This makes it possible to further reduce the size of the change-over circuit.

In this case, the logic of the change-over control signal applied from the logic circuit $G_2$ to the multiplexor is different from that of the embodiment described above. For this reason, the multiplexor MPX produces the selecting timing signal $\phi_{yR}$ as the selection signal L when the change-over control signal is at the low level and the selection timing signal $\phi_{yR}$ as the selection signal R when the change-over control signal is at the high level. Alternatively, the phase-inverted signal of the output signal of the logic circuit $G_2$ can be used as the change-over control signal. The timing signals $\phi_{maL}$, $\phi_{maR}$ for activating the main amplifiers can be formed in the same way as described above.

The selection timing signal $\phi_{yR}$ may be formed on the basis of the selection timing signal $\phi_{ym}$ and the detection signal. That is, when the redundancy memory arrays are selected, too, the selection timing signals $\overline{\phi_{ym}}$ are formed so that the selection timing signals $\phi_{yR}$ can be formed on the basis of the selection timing signals $\overline{\phi_{ym}}$ and the detection signal.

The number of data lines forming the redundancy memory array may be greater than the number of data lines forming the unit memory array. For example, in the embodiment shown in FIG. 1, the number of the complementary data line pairs forming the redundancy memory array may be 9 (sets). In this case, the number of MOSFETs forming the unit column switch corresponding to the redundancy memory array is 18 in accordance with the increase in the number of data lines.

The numbers of the complementary data line pairs of the unit memory array and redundancy memory array need not be eight sets, but may be 9 sets (or some other number of sets), for example. If 9 sets were used in the embodiment shown in FIG. 9, for instance, the unit memory array UMA may include four sets of data line pairs formed on the right side with respect to the column decoder C-DCR11 and five sets of data line pairs formed on the left. In this case, the unit memory array to be formed below this unit memory array UMA preferably contains five sets of data line pairs formed on the right with respect to the column decoder C-DCR11 and four sets of data line pairs formed on the right. This arrangement makes it possible to prevent the occurrence of a useless void on the chip. If the redundancy memory array is constituted in the same way as the unit memory array described above, it is very easy to include 9 sets of data line pairs. In this case, the number of MOSFETs forming the unit column switch is increased and at the same time, the numbers of complementary data line pairs and main amplifiers are also increased.

Thus, the number of data lines forming the unit memory array and redundancy memory array may be arbitrary.

The redundancy memory arrays may be disposed either on the right or on the left alone. In the embodiment shown in FIG. 1, for example, only the redundancy memory array is disposed and only the redundancy circuit RC1 is disposed as the redundancy circuit in response thereto. A steady low level signal is applied to one of the input nodes of the logic circuit $G_2$ forming the change-over circuit COC in place of the detection signal ACR from the redundancy circuit RC2. In this manner, the redundancy memory array described above can be selected in place of the defective data lines in the memory array on the right or in the memory array on the left. According to this arrangement, the main amplifiers MA1, MA2 can also be operated selectively in the same way as described above and the main amplifiers MA1 corresponding to the redundancy memory array R-ARY1 on the right can be operated when the memory array R-ARY1 is selected.

Besides the dynamic RAM described above, the present invention can be widely applied to ROMs (read-only memory), RAMs (random access memory) and the like for reading the data or for writing/reading the data. The present invention can be applied particularly effectively to those memories for reading/writing data of a plurality of bits.

Although particular conductivity types have been assigned to the MOSFETs used in the figures to illustrate the invention, it is to be understood that this is not limiting to this invention, and, if desired, opposite conductivity MOSFETs could be used throughout the circuitry.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. A semiconductor memory device comprising:
   first and second memory arrays, each having a plurality of memory cells formed along rows and columns;
   first selection means for selecting at least one memory cell column designated by first address signals, from said first and second memory arrays upon receiving said first address signals;
   second selection means for selecting memory cell rows from said first and second memory arrays;
   a first common data line for receiving data of a memory cell which has been selected from said first memory array by said first and second selection means;
   a second common data line for receiving data of a memory cell which has been selected from said second memory array by said first and second selection means;
   a first spare memory comprising at least one memory cell column formed with a plurality of memory cells, and providing data of a memory cell designated by said second selection means from said first spare memory to said first common data line in response to a first selection signal;
   a second spare memory comprising at least one memory cell column formed with a plurality of memory cells, and providing data of a memory cell designated by said second selection means from said second spare memory to said second common data line in response to a second selection signal;
   first amplifier means coupled to said first common data line, and operating in response to the selection of a memory cell from said first memory array so that data of the memory cell selected is amplified by said first amplifier means;
   second amplifier means coupled to said second common data line, and operating in response to the selection of a memory cell from said second memory array so that data of the memory cell selected is amplified by said second amplifier means;

first redundancy means receiving second address signals including at least said first address signals, and for generating a first control signal when said second address signals are address signals which select a defective memory cell column from either one of said first and second memory arrays;

second redundancy means receiving said second address signals, and for generating a second control signal when said second address signals are address signals which select a defective memory cell column from either one of said first and second memory arrays; and control means responsive to said first and second control signals, for generating one of said first and second selection signals, for inhibiting the selection of a memory cell column from one of said first and second memory arrays, and for operating either one of said first and second amplifier means so that data of a memory cell in either one of said first and second spare memories instead of the defective memory cell column in either one of said first and second memory arrays is amplified by the one of the first and second amplifier means which is operated.

2. The semiconductor memory device as defined in claim 1, wherein said first redundancy means includes a memory circuit for storing address signals designating a defective memory column and a comparison circuit for comparing said address signals stored in said memory circuit with said second address signals, so that said first control signal is generated when said second address signals are the address signals which select said defective memory cell column, and wherein said second redundancy means includes a memory circuit for storing address signals designating defective memory cell columns and a comparison circuit for comparing said address signal stored in said memory circuit with said second address signals, so that said second control signal is generated when said second address signals are the address signals which select a defective memory cell column.

3. The semiconductor memory device as defined in claim 2, wherein said control means further receives a part of said second address signals and produces said first selection signal for selecting a memory cell from said first spare memory or said second selection signal for selecting a memory cell from said second spare memory.

4. The semiconductor memory device as defined in claim 3, wherein said part of said second address signals is an address signal designating the selection of a memory cell column from either one of said first and second memory arrays.

5. The semiconductor memory device as defined in claim 4, which further includes a timing circuit for generating a timing signal, and wherein said control means comprises a logic circuit coupled to receive said first and second control signals and said part of said second address signals and to produce a change-over control signal, and a multiplexor receiving said timing signal generated by said timing circuit and said change-over control signal generated by said logic circuit and producing said timing signal as said first or second selection signal in accordance with said change-over control signal.

6. The semiconductor memory device as defined in claim 2, wherein said first selection circuit includes a first address decoder which selects a memory cell column from said first memory array and whose operation is controlled by said control means, and a second address decoder which selects a memory cell column from said second memory array and whose operation is controlled by said control means.

7. The semiconductor memory device as defined in claim 2, wherein each of said memory cell rows comprises a word line and a plurality of memory cells whose control terminals are connected to said word line, each of said memory cell columns comprises a data line pair and a plurality of memory cells, each of said memory cells having an output terminal connected to one of the data lines of said data line pair, and each of said first and second common data lines comprises a common data line pair.

8. The semiconductor memory device as defined in claim 7, further comprising a first column switch circuit receiving the selection signal produced from said first selection means and connecting said first common data line pair to a data line pair in said memory cell column in said first memory array selected by said selection signal produced by said first selection means, a second column switch circuit receiving the selection signal produced from said first selection means and connecting said second common data line pair to a data line pair of said memory cell column in said second memory array designated by said selection signal produced from said first selection means, a first spare column switch circuit receiving said first selection signal produced from said control means and connecting said first common data line pair to a data line pair of a memory cell column in said first spare memory in response to said first selection signal, and a second spare column switch circuit receiving said second selection signal produced from said control means and connecting said second common data line pair to a data line pair of a memory cell column in said second spare memory in response to said second selection signal.

9. A semiconductor memory device comprising:
a first memory array having a plurality of memory cells having control and input-output terminals and arranged in a matrix;
a second memory array having a plurality of memory cells having control and input-output terminals and arranged in a matrix;
first selection means for selecting memory cell rows from said first and second memory arrays;
second selection means receiving first address signals, and for selecting memory cell columns designated by said first address signals from said first and second memory arrays;
a plurality of first common data lines for receiving data of memory cells selected by said first and second selection means from said first memory array;
a plurality of second common data lines for receiving data of memory cells selected by said first and second selection means from said second memory array;
a first spare memory array including a plurality of memory cells arranged in a matrix, wherein a spare memory cell row is selected by said first selection means, and data of the memory cells selected are transmitted to said first common data lines in response to a first selection signal;

a second spare memory array including a plurality of memory cells arranged in a matrix, wherein a spare memory cell row is selected by said first selection means, and data of the memory cells selected are transmitted to said second common data lines in response to a second selection signal;

a plurality of first amplifier means coupled to respective ones of said first common data lines, and operating in response to the selection of memory cells from said first memory array so that data of the memory cells selected are amplified by said first amplifier means;

a plurality of second amplifier means coupled to respective ones of said second common data lines, and operating in response to the selection of memory cells from said second memory array so that data of the memory cells selected are amplified by said second amplifier means;

first redundancy means receiving second address signals including at least said first address signals, and for generating a first control signal when said second address signals are address signals which select a defective memory cell column from either one of said first and second memory arrays;

second redundancy means receiving said second address signals, and for generating a second control signal when said second address signals are address signals which select a defective memory cell column from either one of said first and second memory arrays;

control means responsive to said first and second control signals, for generating one of said first and second selection signals, for inhibiting the selection of memory cell columns from one of said first and second memory arrays, and for operating ones of said first and second amplifier means so that data of memory cells in either one of said first and second spare memory arrays instead of memory cells in either one of said first and second memory arrays are amplified by the one of the first and second amplifier means which is operated.

10. The semiconductor memory device as defined in claim 9, wherein said first redundancy means includes a memory circuit for storing address signals designating the defective memory cell column and a comparison circuit comparing said address signals stored in said memory circuit with said second address signals, whereby said first redundancy means produces said first control signal when said address signals stored in said memory circuit and said second address signals coincide with each other, and wherein said second redundancy means includes a memory circuit for storing address signals designating the defective memory cell column and a comparison circuit comparing said address signals stored in said memory circuit with said second address signals, whereby said second redundancy means produces said second control signal when said address signals stored in said memory circuit and said second address signals coincide with each other.

11. The semiconductor memory device as defined in claim 9, wherein said control means comprises a logic circuit receiving said first and second control signals and a part of said second address signals, first means receiving the change-over control signal produced from said logic circuit and for generating one of said first and second selection signals, and second means receiving said change-over control signal and for generating a first timing signal for controlling the operation of said first amplifier means and a second timing signal for controlling the operation of said second amplifier means.

12. The semiconductor memory device as claimed in claim 10, wherein each of said memory cell rows comprises a word line and a plurality of memory cells whose control terminals are connected to said word line, each of said memory cell columns comprises a data line pair and a plurality of memory cells, whose input-output terminals are connected to one of the data lines of said data line pair, each of said first common data lines comprises a common data line pair, and each of said second common data lines comprises a common data line pair.

13. The semiconductor memory device as defined in claim 12, further comprising a first switch circuit coupled between said first memory array and said first common data lines, a second switch circuit coupled between said second memory array and said second common data lines, a first spare switch circuit coupled between said first spare memory array and said first common data lines, and a second spare switch circuit coupled between said second spare memory array and said second common data lines, and wherein said second selection means comprises a first address decoder producing selection signals to be supplied to said first switch circuit, and a second address decoder producing selection signals to be supplied to said second switch circuit, and wherein the operation of said first spare switch circuit is controlled by said first selection signal, and the operation of said second spare switch circuit is controlled by said second selection signal.

14. The semiconductor memory device as defined in claim 13, wherein said first switch circuit connects a plurality of data line pairs to a plurality of corresponding first common data line pairs to which said first amplifier means are connected, respectively, and which are designated by said selection signals produced from said first address decoder, and said second switch circuit connects a plurality of data line pairs to a plurality of corresponding second common data line pairs to which said second amplifier means are connected, respectively, and which are designated by said selection signals produced from said second address decoder, and wherein said first spare switch circuit connects a plurality of line pairs in said first spare memory array to a plurality of corresponding first common data line pairs, respectively, upon receiving said first selection signal, and said second spare switch circuit connects a plurality of data line pairs in said second spare memory array to a plurality of corresponding second common data lines, respectively, upon receiving said second selection signal.

15. The semiconductor memory device as defined in claim 14, wherein each of said first switch circuit, second switch circuit, first spare switch circuit and second spare switch circuit comprises switch MOSFETs interposed between respective data lines and corresponding common data lines.

16. The semiconductor memory device as defined in claim 13, wherein each of said memory cells comprises a capacitor and a MOSFET whose gate electrode is connected to said control terminal, one of its electrodes being connected to said input-output terminal and the other being connected to said capacitor.

17. The semiconductor memory device as defined in claim 8, wherein said first selection means comprises a first address decoder circuit for providing said selection signal to be supplied to said first column switch circuit, and a second address decoder circuit for providing said selection signal to be supplied to said second column switch circuit.

18. The semiconductor memory device as defined in claim 8, further comprising a timing signal generating circuit, and wherein said control means comprises means receiving a timing signal produced from said timing signal generating circuit and for generating a first timing signal for controlling the operation of said first amplifier means and a second timing signal for controlling the operation of said second amplifier means.

19. The semiconductor memory device as defined in claim 16, further comprising a timing circuit, and wherein said control means comprises means receiving a timing signal produced from said timing circuit and for generating a first timing signal for controlling the operation of said first amplifier means and a second timing signal for controlling the operation of said second amplifier means.

20. A semiconductor memory device comprising:
first and second memory arrays, each having a plurality of memory cells formed along rows and columns;
first selection means for selecting at least one memory cell column indicated by first address signals from said first and second memory arrays;
a first common data line for receiving data of a memory cell in the memory cell column selected by said first selection means from said first memory array;
a second common data line for receiving data of a memory cell in the memory cell column selected by said first selection means from said second memory array;
a spare memory comprising at least one memory cell column formed with a plurality of memory cells, and providing data of a memory cell in said spare memory to said first common data line in response to a predetermined selection signal;
first amplifier means coupled to said first common data line, and operating in response to the selection of a memory cell from said first memory array so that data on said first common data line is amplified by said first amplifier means;
second amplifier means coupled to said second common data line, and operating in response to the selection of a memory cell from said second memory array so that data on said second common data line is amplified by said second amplifier means;
redundancy means receiving second address signals comprising at least said first address signals, and for generating a control signal when said second address signals are address signals which select a defective memory cell column from either one of said first and second memory arrays; and
control means responsive to said control signal, for generating said predetermined selection signal, for inhibiting the selection of a memory cell column from said first memory array, and for generating a timing signal for operating said first amplifier means so that data of a memory cell in said spare memory instead of the defective memory cell column in either one of said first and second memory arrays is amplified by said first amplifier means.

21. The semiconductor memory device as defined in claim 20, wherein each of said memory cell columns comprises a data line pair and a plurality of memory cells, each of said memory cells having an output terminal coupled to one of the data lines of said data line pair, and wherein each of said first and second common data lines comprises a common data line pair.

22. The semiconductor memory device as defined in claim 21, wherein said redundancy means comprises a memory circuit for storing address signals which indicate said defective memory cell column from either one of said first and second memory arrays, and a comparison circuit for comparing said address signals stored in said memory circuit with said second address signals and for generating said control signal when said second address signals are address signals which select said defective memory cell column from either one of said first and second memory arrays.

* * * * *